United States Patent [19]

Uno et al.

[11] Patent Number: 5,795,683
[45] Date of Patent: Aug. 18, 1998

[54] METHOD AND A SYSTEM FOR DESIGNING A PHOTOMASK FOR USE IN MANUFACTURE OF A SEMICONDUCTOR DEVICE

[75] Inventors: Taiga Uno, Kawasaki; Kiyomi Koyama, Yokohama; Kazuko Yamamoto, Tokyo, all of Japan

[73] Assignee: Kabushiki Kaisha Toshiba, Kawasaki, Japan

[21] Appl. No.: 622,411

[22] Filed: Mar. 27, 1996

[30] Foreign Application Priority Data

Mar. 27, 1995 [JP] Japan .................................. 7-067269
Mar. 18, 1996 [JP] Japan .................................. 8-061446

[51] Int. Cl.$^6$ .................................................... G03F 9/00
[52] U.S. Cl. ............................................. 430/5; 430/311
[58] Field of Search .................................. 430/5, 311, 394

[56] References Cited

U.S. PATENT DOCUMENTS

5,538,815 7/1996 Oi et al. ............................. 430/5
5,541,025 7/1996 Oi et al. ............................. 430/5

FOREIGN PATENT DOCUMENTS

5-341497 12/1993 Japan .
6-167801 6/1994 Japan .
6-308714 11/1994 Japan .

OTHER PUBLICATIONS

Symposium on VLSI Technology Digest of Technical Papers, pp. 1060–1061, 1991, Y. Hirai, et al., "Automatic Pattern Generation System for Phase Shifting Mask".

International Electron Devices Meeting, pp. 24.4.1–27.4.4, 1991, Alexander S. Wong, et al., "Investigating Phase–Shifting Mask Layout Issues Using a Cad Toolkit".

Jpn. J. Appl. Phys. vol. 32, No. 12B, pp. 5874–5879, Dec. 1993, Akemi Moniwa, et al., "Algorithm for Phase–Shift Mask Design with Priority on Shifter Placement".

*Primary Examiner*—S. Rosasco
*Attorney, Agent, or Firm*—Oblon, Spivak, McClelland, Maier & Neustadt, P.C.

[57] ABSTRACT

A method for designing a photomask, used in photolithography using partially coherent incident light, the photomask having a substrate on which a plurality of transparent regions and opaque regions are formed, the transparent regions including a phase shifter for providing the incident light transmitting through the transparent regions with a phase difference, the method comprising the steps of extracting combinations of patterns adjacent to each other within a distance of a threshold value S2 as adjacent pairs from patterns corresponding to the transparent regions, calculating difficulty of correction of the adjacent pairs, sorting the adjacent pairs in an descending order of the difficulty of correction, connecting the patterns in the adjacent pairs to one another, such that a pair of adjacent patterns are not connected to each other and loop cut is performed if a closed loop is formed by connecting the adjacent patterns, and a pair of adjacent patterns are logically connected if a closed loop is not formed by connecting the adjacent patterns, and determining phases of light transmitted through the patterns, so that a phase of one of a pair of patterns is opposite to that of the other, on the basis of an inversion relationship finally obtained by the connecting step.

32 Claims, 23 Drawing Sheets

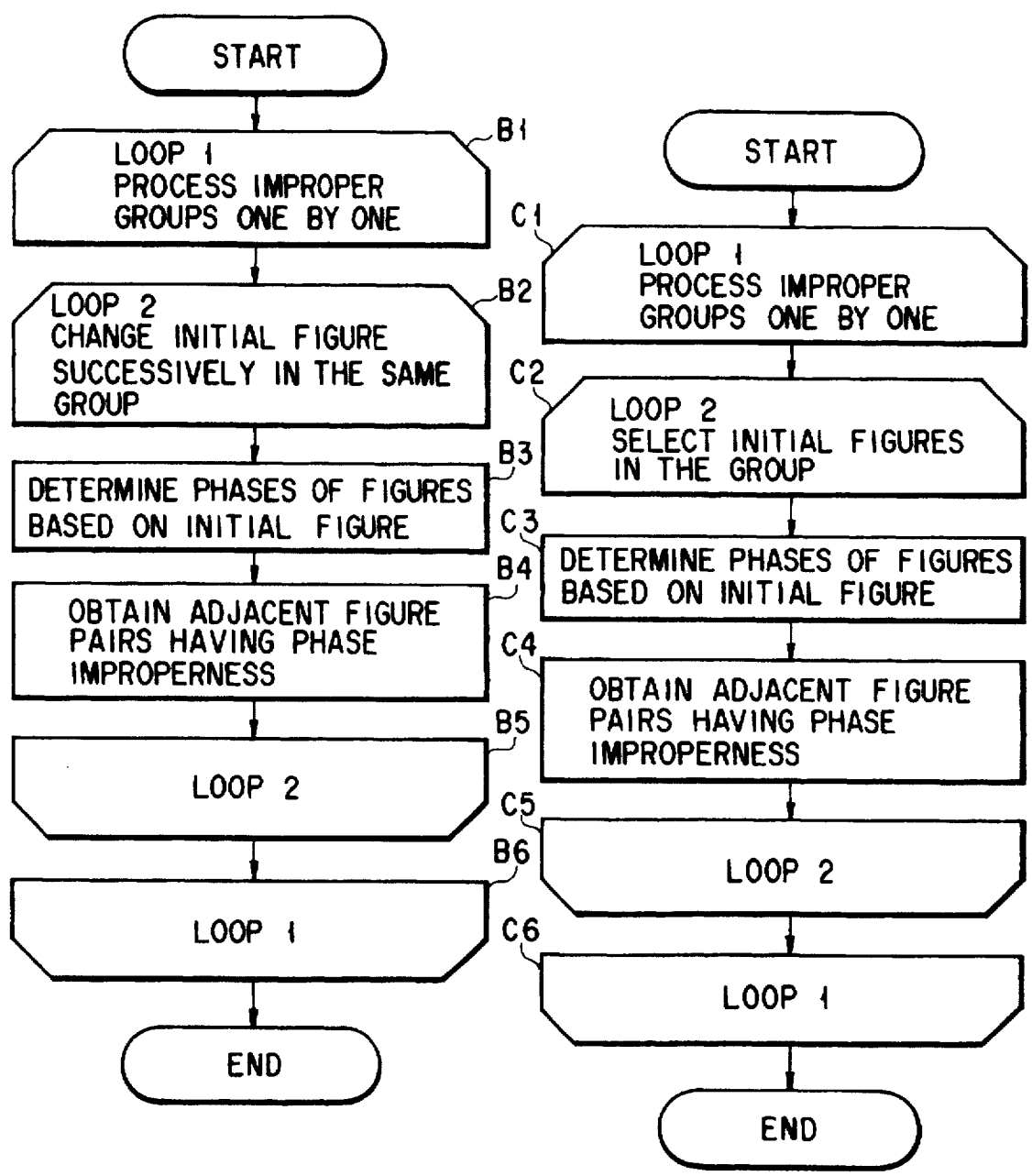
F I G. 3
F I G. 4

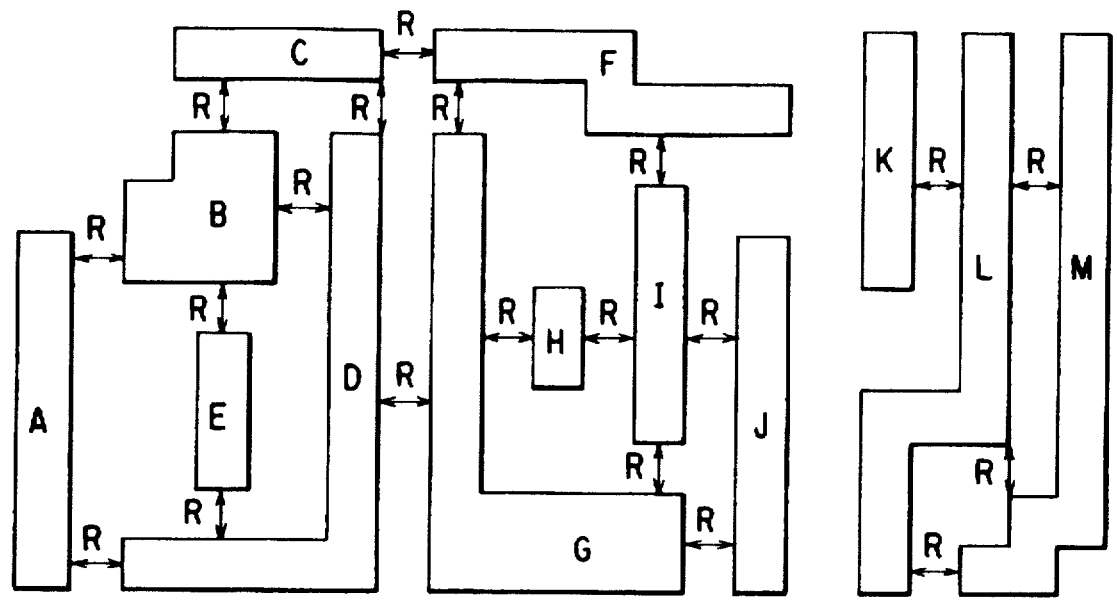
F I G. 7
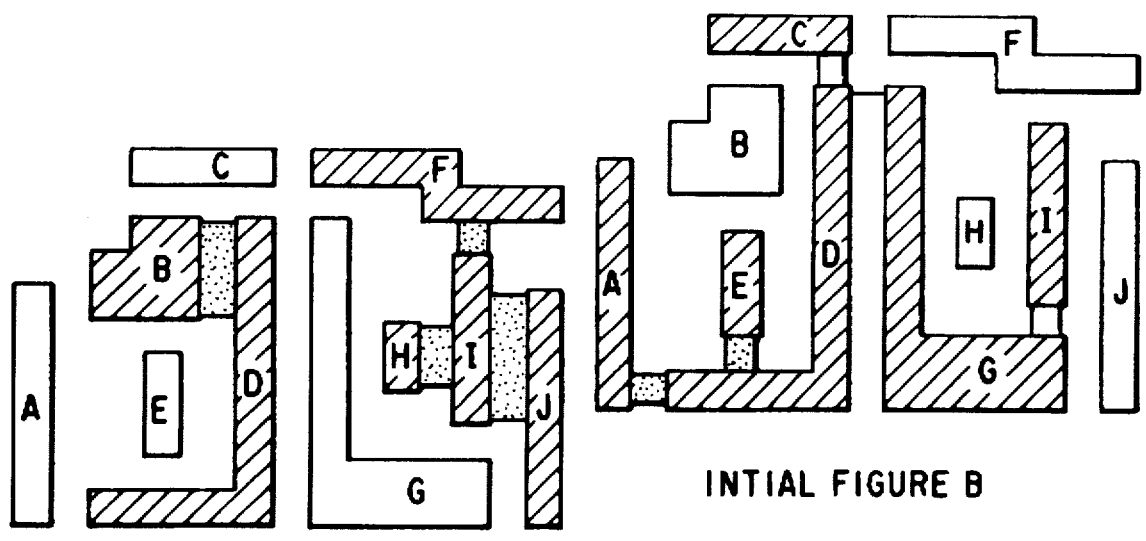
INITIAL FIGURE A
F I G. 8A
INITIAL FIGURE B
▨ IMPROPER PORTION
☐ INITIAL FIGURE
▧ PHASE-INVERTED FIGURE (SHIFTER)
F I G. 8B

INITIAL FIGURE C

INITIAL FIGURE E

INITIAL FIGURE D

▨ INPROPER PORTION
☐ INITIAL FIGURE
▨ PHASE-INVERTED FIGURE (SHIFTER)

INITIAL FIGURE F

▨ INPROPER PORTION
☐ INITIAL FIGURE
▨ PHASE-INVERTED FIGURE (SHIFTER)

INITIAL FIGURE G

INITIAL FIGURE I

INITIAL FIGURE H

▒ INPROPER PORTION
☐ INITIAL FIGURE
▨ PHASE-INVERTED FIGURE (SHIFTER)

INITIAL FIGURE J

▒ INPROPER PORTION
☐ INITIAL FIGURE
▨ PHASE-INVERTED FIGURE (SHIFTER)

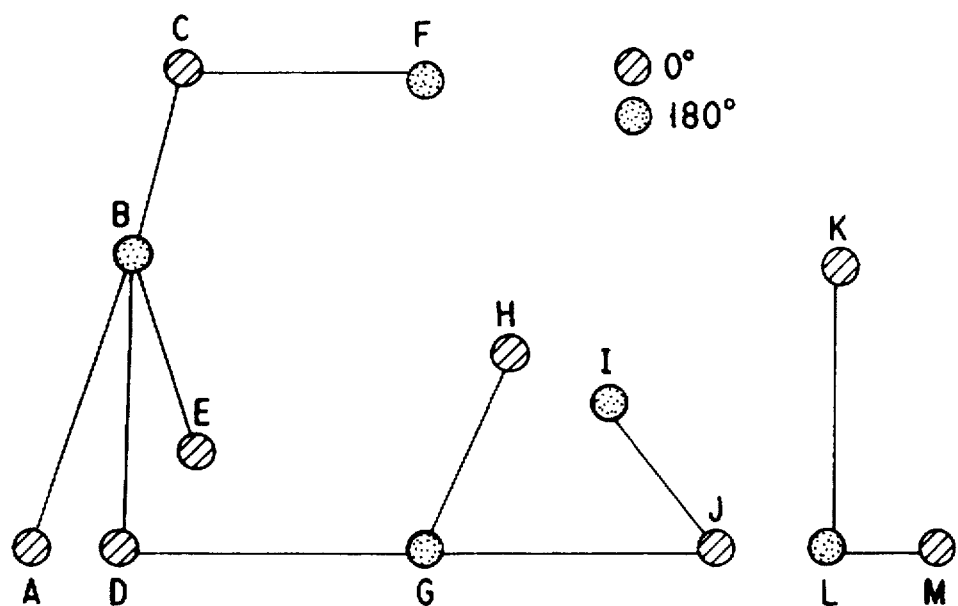
F I G. 22
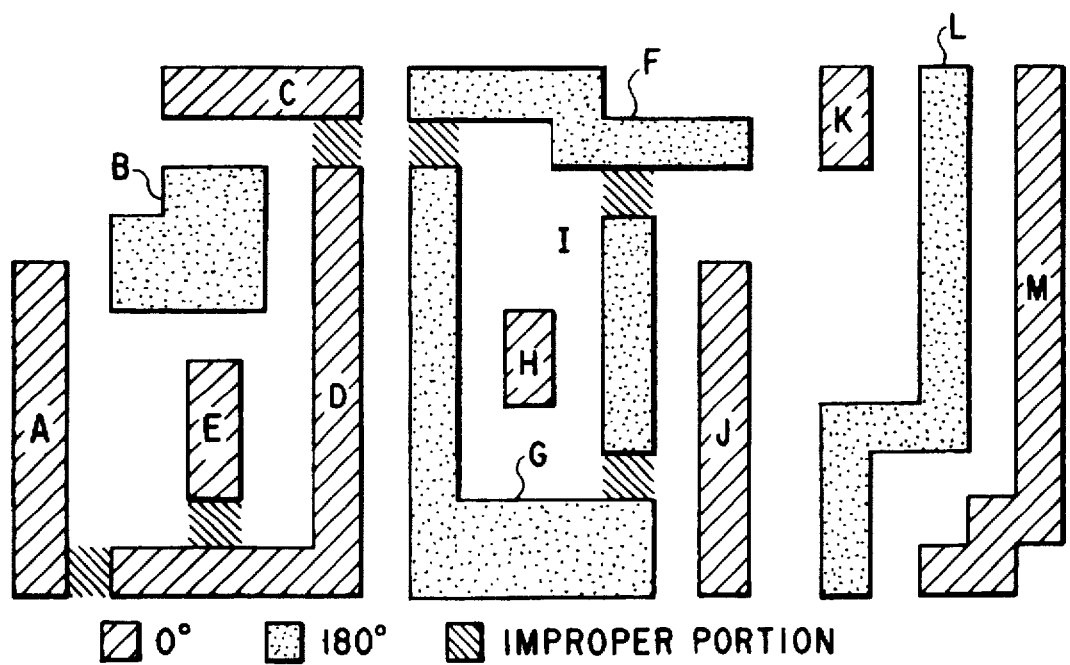
F I G. 23

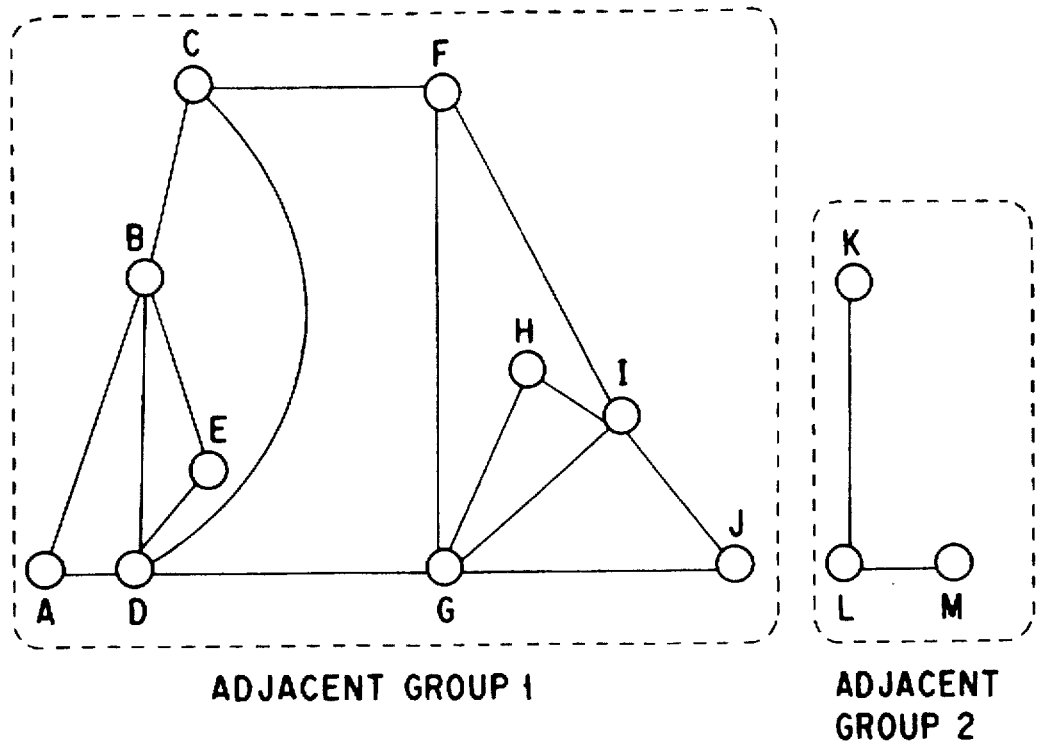
F I G. 25
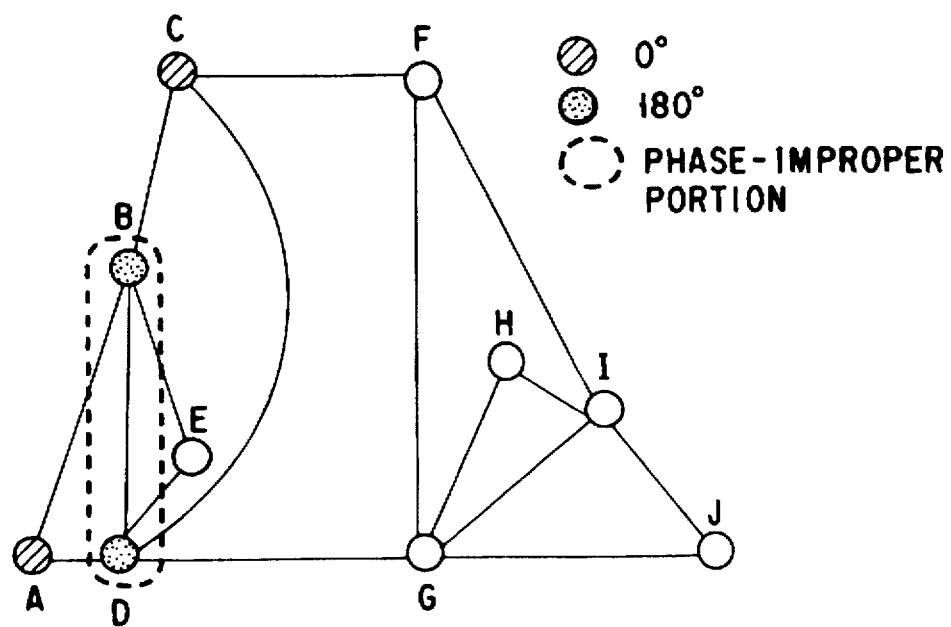
F I G. 26

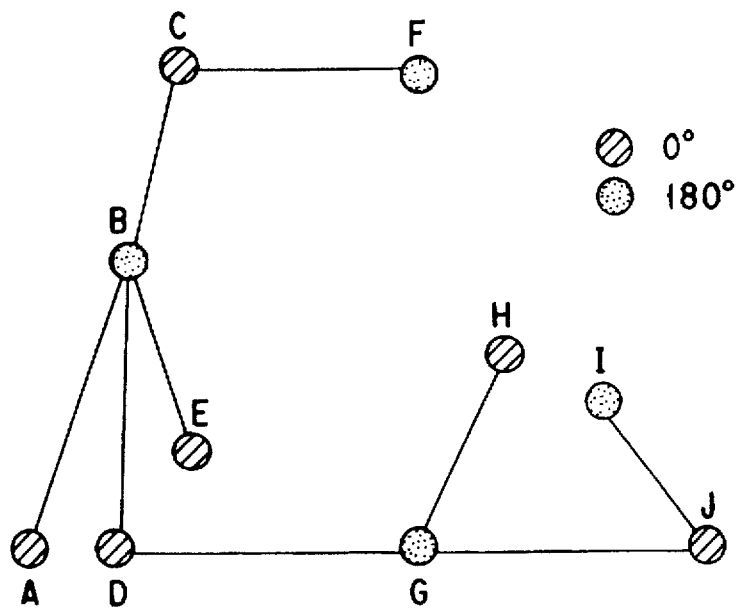
F I G. 27
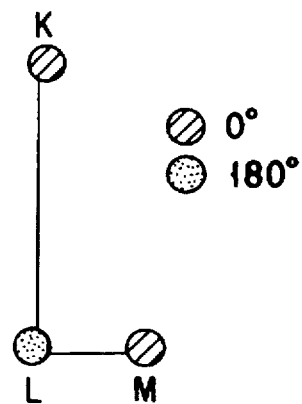
F I G. 28
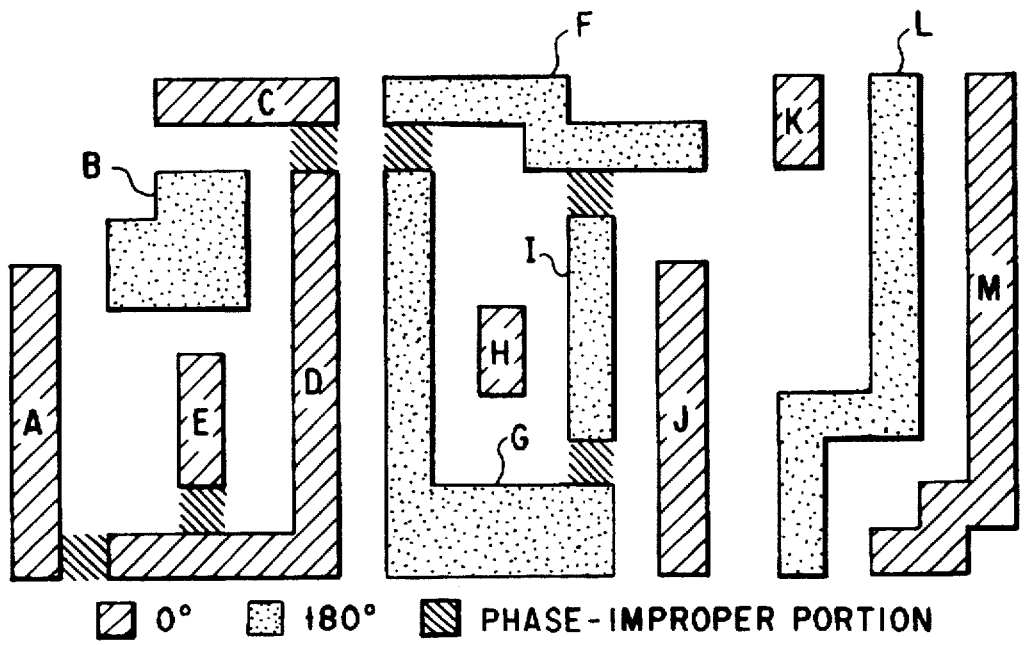
F I G. 29

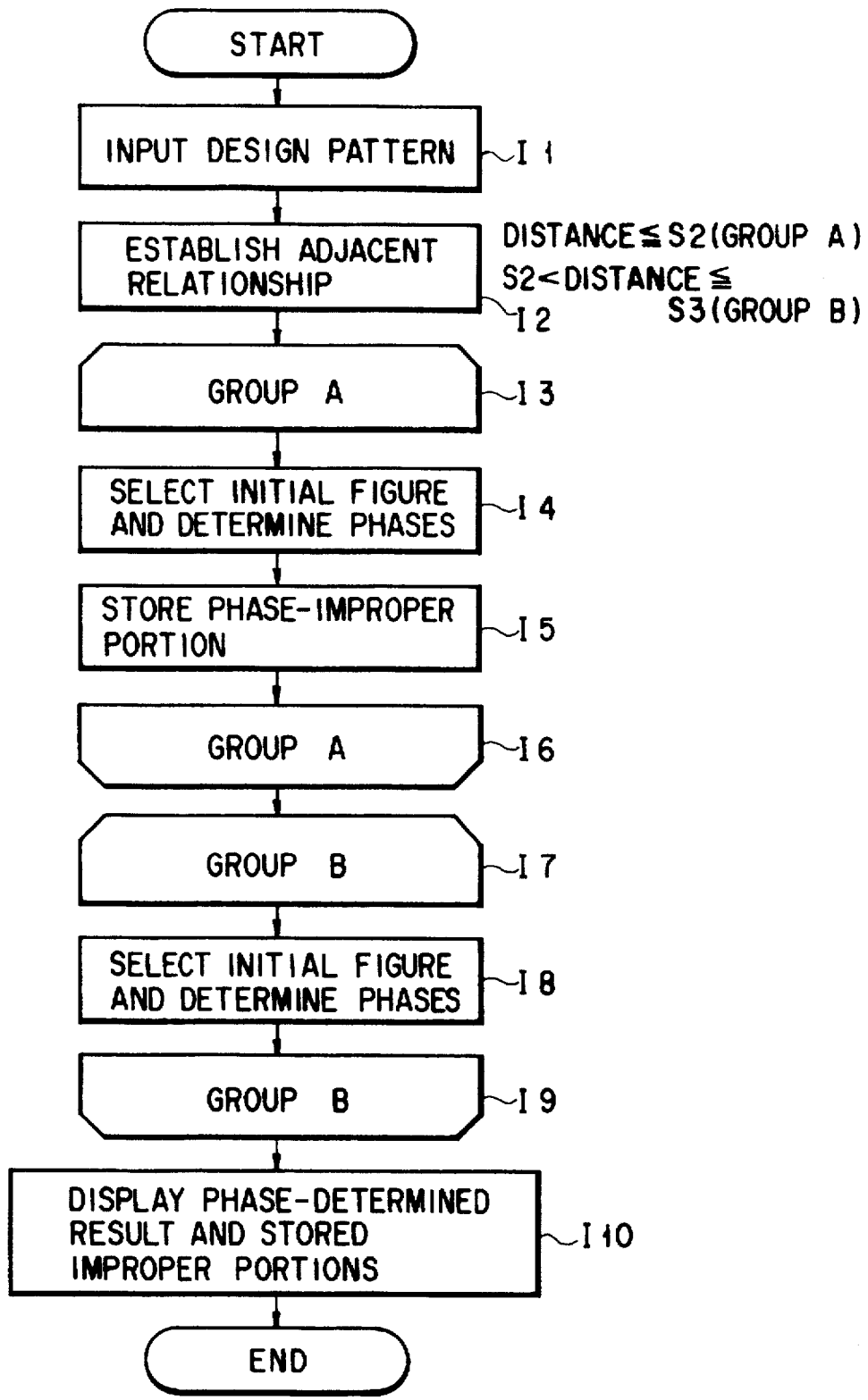
F I G. 30

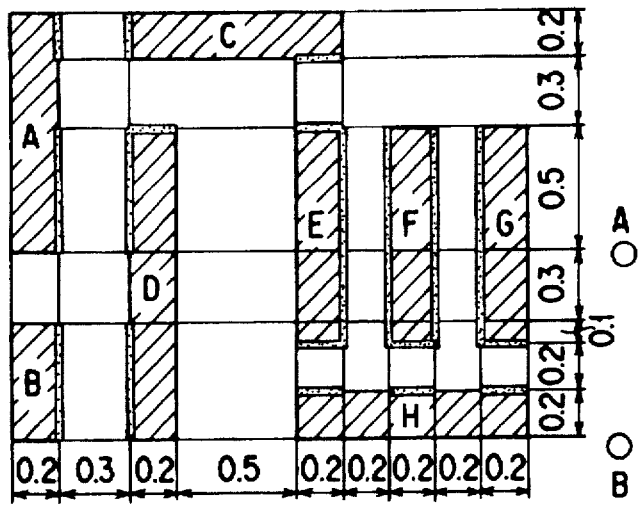
F I G. 31
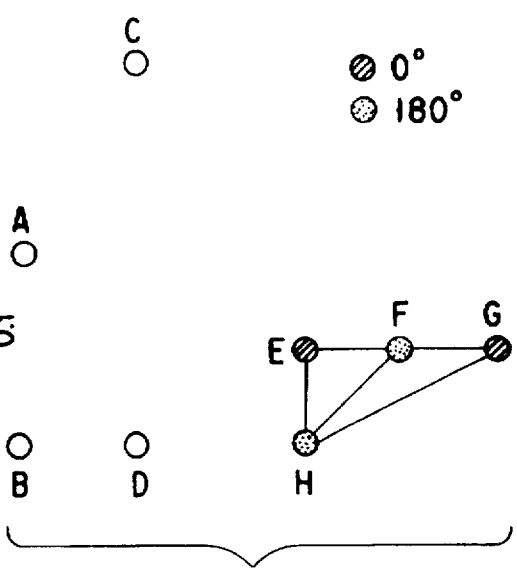
F I G. 32
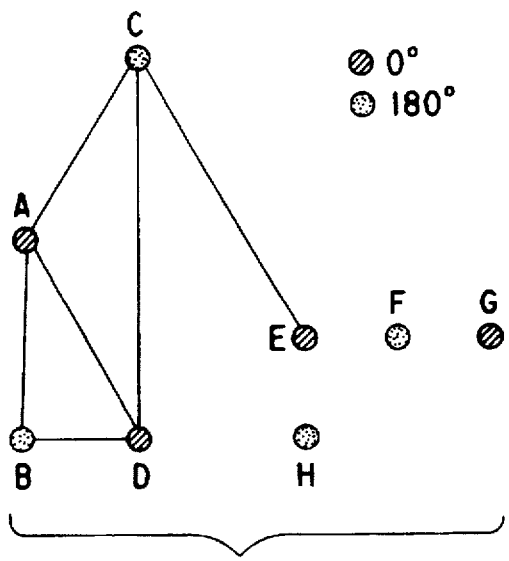
F I G. 33
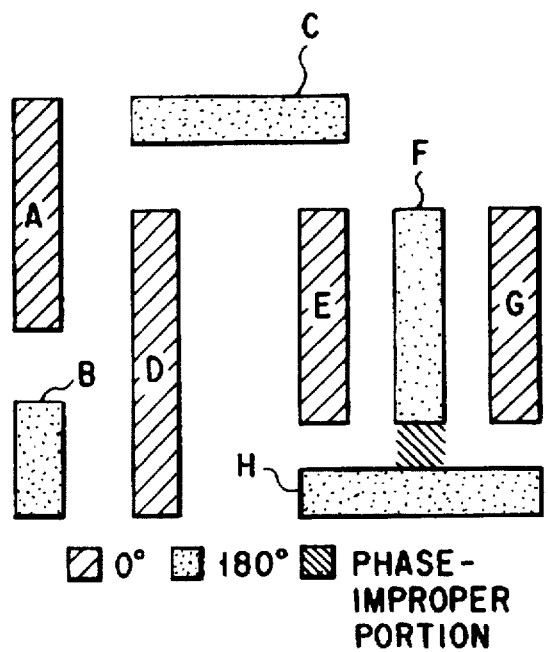
F I G. 34

METHOD AND A SYSTEM FOR DESIGNING A PHOTOMASK FOR USE IN MANUFACTURE OF A SEMICONDUCTOR DEVICE

BACKGROUND OF THE INVENTION

1. Field of the Invention

The present invention relates generally to designing of a photomask for use in manufacture of a semiconductor device, and more particularly to a method and a system for designing a photomask, suitable for transferring a fine pattern, for use in manufacture of a semiconductor device, and also a semiconductor device manufacturing system.

2. Description of the Related Art

First prior art, relating to a Levenson type phase shifting mask automatic designing apparatus, is described in a paper titled 'Automatic Pattern Generation System for Phase Shifting Mask' by N. Nomura et al., in "Symposium of VLSI Technology", pp. 95–96, Oiso, Japan (May, 1991). The paper discloses a dynamic random access memory (DRAM) designed by means of a phase shifting mask automatic designing apparatus of Levenson type. According to the disclosure of the paper, the phase of a figure is determined as follows. When the shift of light transmitted through a figure is automatically determined, an arbitrary figure is selected first and the phase of the figure is determined to be 0°. The phase of a second arbitrary figure is determined to be opposite to that of the first figure, whose phase has already been determined and whose longest side faces the longest side of the second figure to be phase-determined now. If there are a plurality of figures whose longest side faces the longest side of the figure to be phase-determined, and the phases of the figures are different from one another, an alarm is generated to stop the process. The method as described above is called the shifter automatic placement method.

Second prior art is described in a paper titled 'Investigating Phase-shifting Mask Layout Issues Using a CAD Toolkit' by Andrew. R. Neureuther, in "IEDM Tech. Digest", pp. 705–708, 1991. This paper discloses an apparatus, in which the reduction ratio of a given design pattern is determined by a designer, and the shifter is automatically placed with respect to the reduced pattern. In this apparatus, if there is an improper portion in the shifter placement, the portion is displayed.

Third prior art is also described in this paper. The paper discloses a method in which, if the distance between two transparent regions is smaller than a threshold value, a shifter is placed in one of the transparent regions. If there is improper shifter placement, it also discloses an apparatus having functions of shifter automatic placement, shifter placement verification, and a shifter placement and verification with respect to a layout in which a shifter has been partially placed.

Fourth prior art is also described in the above paper, which discloses a technique of weighting sides constituting a closed loop in various conditions and correcting a figure pattern corresponding to the nodes on both the ends of at least one side of the closed loop in the order of the weight of the side.

Fifth prior art is disclosed in a paper titled 'Algorithm for Phase-Shift Mask Design with Priority on Shifter Placement' by Akemi Moniwa et al. in Japanese Journal of Applied Physics, Vol. 32 (1993), pp. 5874–5879. In the algorithm, informations of a pair of adjacent figures located with a distance X or smaller therebetween (hereinafter referred to as an adjacent aperture pair) is created with respect to an input layout, and pairs are sorted in the order of difficulty of correction. More specifically, the pairs are sorted in the order of the priority of the sides of the figures given by the designer in accordance with the difficulty of correction (a first key of sort), in the ascending order of the shortest width of all the widths perpendicular to a surface adjacent to the figure with the distance X therebetween (a second key of sort), and in the descending order of the length of the planes which face with the distance X therebetween (a third key of sort). The phase is determined in the order of sort.

In the aforementioned first to third prior art, if a phase-improper portion exists, it may simply result from a specific initial figure. If the initial figure is changed to another one, a preferable phase may be obtained. In the fourth and fifth prior art, a phase-improper portion can be easily corrected. However, as regards the fourth prior art, it is known that, in practice, the algorithm for detecting a closed loop requires a number of calculations, when a computer actually executes the algorithm. As regards the fifth prior art, since the factors of the sort must be calculated with respect to all the adjacent aperture pairs, a great amount of process time is required in actual calculation by a computer.

Further, although the above prior art references do not provide detailed description of phase determination and an embodiment thereof, the prior art has a problem that, if a shifter is provided in one of the figure pairs in the sorted order, it may be necessary to invert the phase during the process, with the result that the process is complicated and time-consuming.

SUMMARY OF THE INVENTION

The present invention has been made in consideration of the aforementioned problems of the prior art, so that phase-improper adjacent apertures can easily be corrected, or even if the phases of the adjacent aperture are improper, the improperness may influence the designing as little as possible, and that the designing can be performed at higher speed and less memory consumption, on the assumption of using a computer.

In the lithography after the IGDRAM, it is known from exposure simulation or the like that the resolution of so-called isolated patterns (separated from each other with a critical distance which can be resolved only by means of a Levenson phase shifting method) can be increased by locating shifters therein.

An object of the present invention is to provide a designing method and system by which an improper portion relatively easy to correct can be discovered efficiently in designing a photomask by means of Levenson phase shifting method.

Another object of the present invention is to provide a designing method and system in which Levenson phase shifting method is applicable to isolated patterns, whose resolutions can be increased by means of Levenson phase shifting method.

To solve the above problems, according to a first principle of the present invention, there is provided a method for designing a photomask, used in photolithography using partially coherent incident light, the photomask having a substrate on which a plurality of transparent regions and opaque regions are formed, the transparent regions including a phase shifter for providing the incident light transmitting through the transparent regions with a phase difference, the method comprising, to determine the phase of light transmitted through each transparent region, a first function, as shown in FIG. 2, including Steps A1 to A3, for forming groups of figures adjacent to one another within a distance S1 from a plurality of figures corresponding to the plurality of transparent regions represented by the mask layout data, and determining phases of the figures in each of the groups such that paired figures adjacent to each other have opposite phases, thereby obtaining an improper group of paired figures adjacent to each other having the same phase; and a second function, as shown in FIG. 3, including Steps B1 to B6, for determining phases of the figures, while an initial figure is successively changed in the improper group, thereby obtaining a phase-improper group of figures with respect to each initial figure.

The method of the present invention further comprises a step of executing a process for sorting the figures in the improper group with respect to each initial figure obtained by the second function in an ascending order of the number of improper portions, and displaying an initial figure, a result of the phase determination and the figures in the improper portion, in a sorted order.

The method of the present invention further comprises a step of executing a process for sorting the group of figures in the improper portion obtained by the second function in an order of easiness of correction based on comparison and evaluation as to whether an improper portion is easy to correct, and displaying an initial figure, a result of the phase determination and the figures in the improper portion, in a sorted order.

There is also provided a method for designing a photomask, used in photolithography using partially coherent incident light, the photomask having a substrate on which a plurality of transparent regions and opaque regions are formed, the transparent regions including a phase shifter for providing the incident light transmitting through the transparent regions with a phase difference, the method comprising, to determine the phase of light transmitted through each transparent region, a first function, as shown in FIG. 2, for forming groups of figures adjacent to one another within a distance S1 from a plurality of figures corresponding to the plurality of transparent regions represented by the mask layout data, and determining phases of the figures in each of the groups such that paired figures adjacent to each other have opposite phases, thereby obtaining an improper group of paired figures adjacent to each other having the same phase; and a third function, as shown in FIG. 4, including Steps C1 to C6, for designating a plurality of initial figures in an improper portion, determining phases of the designated figures, and obtaining an improper portion in each of combinations of the phase-determined initial figures.

The method of the present invention further comprises a step of executing a process for sorting the figures in the improper group obtained by the third function in an ascending order of the number of improper portions, and displaying an initial figure, a result of the phase determination and the figures in the improper portion, in a sorted order.

The method of the present invention further comprises a step of executing a process for sorting the group of figures in the improper portion obtained by the third function in an order of easiness of correction based on comparison and evaluation as to whether an improper portion is easy to correct, and displaying an initial figure, a result of the phase determination and the figures in the improper portion, in a sorted order.

The present invention according to the first principle has the following effects. First means execute the second function with respect to the improper groups obtained by the first function. The improper portion and the result of the phase determination obtained by the second function are displayed, and a pattern, which is the easiest to correct, is selected from all the phase-determined patterns. With this means, since the number of combinations selected by the designer is restricted to the number of figures in the improper groups, the phase-determined pattern, which is the easiest to correct, can be obtained quickly.

Second means sort results of the phase determination obtained in the first means by the second function in an ascending order of the number of improper portions, and display an initial figure, a result of the phase determination and the figures in the improper portion, in a sorted order. With this means, since phase-determined patterns can be obtained in an ascending order of the number of improper portions, a pattern easy to correct can be selected by the designer more readily as compared to the first means.

Third means sort results of the phase determination obtained in the first means by the second function in an order of easiness of correction based on comparison and evaluation as to whether an improper portion is easy to correct, and display an initial figure, a result of the phase determination and the figures in the improper portion, in a sorted order. With this means, a pattern easy to correct can be selected by the designer more readily as compared to the second means.

Fourth means execute the second function with respect to the improper groups obtained by the first function. The improper portion and the result of the phase determination in the combination of the initial figures obtained by the third function are displayed, and a pattern, which is the easiest to correct, is selected from all the phase-determined patterns. With this means, the probability of selecting a phase-determined pattern, which is easier to correct as compared to the first to third means, can be increased.

Fifth means sort results of the phase determination in the combination of the initial figures obtained in the fourth means by the third function in an ascending order of the number of improper portions, and display an initial figure, a result of the phase determination and the figures in the improper portion, in a sorted order. With this means, since phase-determined patterns can be obtained in an ascending order of the number of improper portions, a pattern easy to correct can be selected by the designer more readily as compared to the fourth means.

Sixth means sort results of the phase determination in the combination of the initial figures obtained in the fourth means by the third function in an order of easiness of correction based on comparison and evaluation as to whether an improper portion is easy to correct, and display an initial figure, a result of the phase determination and the figures in the improper portion, in a sorted order. With this means, a pattern easy to correct can be selected by the designer more readily as compared to the fifth means.

According to a second principle of the present invention, there is provided first means for designing a photomask, used in photolithography using partially coherent incident light, the photomask having a substrate on which a plurality of transparent regions and opaque regions are formed, the transparent regions including a phase shifter for providing the incident light transmitting through the transparent regions with a phase difference, the means having, to determine the phase of light transmitted through each transparent region, a function of extracting combinations of patterns adjacent to each other within a distance of a threshold value S2; obtaining difficulty of correction of the combinations;

sorting the combinations in a descending order of the difficulty of correction by means of calculation; forming an inversion relationship based on a result of sorting; and determining phases of the patterns in accordance with the inversion relationship.

There is also provided second means for designing a photomask, used in photolithography using partially coherent incident light, the photomask having a substrate on which a plurality of transparent regions and opaque regions are formed, the transparent regions including a phase shifter for providing the incident light transmitting through the transparent regions with a phase difference, the means having, to determine the phase of light transmitted through each transparent region, a function of obtaining an adjacent relationship of patterns adjacent to each other within a distance of a threshold value S2 with respect to patterns corresponding to the transparent regions; extracting combinations of patterns adjacent to each other in every adjacent group which is connected in accordance with the adjacent relationship; sorting the combinations in a descending order of difficulty of correction; forming an inversion relationship based on a result of sorting; and determining phases of the patterns in accordance with the inversion relationship.

Third means have a function of forming an inversion relationship in an order of adjacent pairs extracted in the first means.

Fourth means have a function of forming an inversion relationship in an order of adjacent pairs extracted in the second means in every adjacent group.

Fifth means have a function of determining phases on the basis of the adjacent relationship in every adjacent group in the second means and forming an inversion relationship in an adjacent group in which phase improperness is generated.

Sixth means store data of a single or a plurality of adjacent pairs obtained by a NAND operation of an adjacent relationship and an inversion relationship in first to fifth means, extract an adjacent pair of the same phase from the data after determining phases, and indicate the pair as a phase-improper portion.

Seventh means use the threshold value S2 defined as a limit distance which can be resolved only by Levenson type phase shifting method in the second to fifth means.

Eighth means store data of loop-cut adjacent pairs in the first to fifth means, extract an adjacent pair of the same phase from the data after determining phases, and indicate the pair as a phase-improper portion.

There is also provided ninth means for designing a photomask, used in photolithography using partially coherent incident light, the photomask having a substrate on which a plurality of transparent regions and opaque regions are formed, the transparent regions including a phase shifter for providing the incident light transmitting through the transparent regions with a phase difference, the means having a function of: designating as S2 a distance which cannot be resolved when phases of an adjacent pair of patterns are the same, and as S3 a distance which is greater than the distance S2; first, determining phases of patterns adjacent to each other with the distance S2 or smaller;

and thereafter, determining phases of patterns adjacent to each other with a distance greater than S2 and equal to or smaller than S3.

Tenth means form an adjacent relationship of pairs of patterns adjacent to each other within a distance S3, greater than a distance S2 which cannot be resolved when phases of an adjacent pair of patterns are the same, in the first, second and fifth means, and sort the adjacent pairs by designating a distance between patterns of S2 or smaller as a first key, and difficulty of correction as a second key.

Eleventh means form an adjacent relationship of pairs of patterns adjacent to each other within a distance S3, greater than a distance S2 which cannot be resolved when phases of an adjacent pair of patterns are the same, in the third and fourth means, and an inversion relationship of pairs of patterns adjacent to each other within the distance S2.

Twelfth means use a value of S3 determined to be a critical distance as to whether resolution is improved by providing the phase difference in the ninth to eleventh means.

The present invention according to the first principle has the following effects. In the first means, combinations of patterns adjacent to each other within a distance of a threshold value S2 are extracted from input design patterns; the combinations are sorted in a descending order of the difficulty of correction by means of calculation; an inversion relationship is formed based on a result of sorting; and phases of the patterns are determined in accordance with the inversion relationship. With this means, an adjacent pair patterns of the same phase (improper phase) becomes the easiest to correct.

In the second means, an adjacent relationship of patterns adjacent to each other within a distance of a threshold value S2 is obtained from the input design patterns; the combinations are sorted with respect to every adjacent group in a descending order of difficulty of correction; an inversion relationship is formed based on a result of sorting; and phases of the patterns are determined in accordance with the inversion relationship. With this means, an adjacent pair phase-improper patterns become easy to correct. Since the combinations are sorted in units of adjacent group, the number of adjacent pairs to be sorted is reduced, thereby reducing memory consumption.

In the third means, combinations of patterns adjacent to each other within a distance of a threshold value S2 are extracted from input design patterns; an inversion relationship is formed in the extracted order; and phases are determined on the basis of the inversion relationship. With this means, phases can be determined irrespective of the easiness of correction.

In the fourth means, an adjacent relationship of patterns adjacent to each other within a distance of a threshold value S2 is obtained from the input design patterns; adjacent pairs are extracted in every adjacent group; an inversion relationship is formed in the extracted order; and phases of the patterns are determined in accordance with the inversion relationship. With this means, phases can be determined irrespective of the easiness of correction. Further, in a case where an inversion relationship is obtained after extracting all the adjacent pairs, since the extraction is performed in units of adjacent group, the number of adjacent pairs to be extracted can be reduced, thereby reducing memory consumption.

In the fifth means, an adjacent relationship patterns adjacent to each other within a distance of a threshold value S2 is obtained from the input design patterns, and phases are determined so that a phase of one of paired patterns is opposite to that of the other, on the basis of the adjacent relationship from an initial figure. In this time, if the phase of a pattern is the same as that of an adjacent pattern, the phase determining operation is immediately stopped, all the adjacent pairs in the adjacent group are extracted, and the correction easiness is calculated. The combinations are sorted on the basis of the data obtained by the calculation, and an inversion relationship is formed in the sorted order. The phases are determined on the basis of the inversion relationship. With this means, an adjacent pair of phase-improper patterns become easy to correct. Since the combinations are sorted in units of adjacent group, the number of adjacent pairs to be sorted is reduced, thereby reducing memory consumption. Further, since correction easiness need not be calculated with respect to an adjacent group in which phase improperness is not generated, the process speed can be increased.

In the sixth means, data of an adjacent pair obtained by a NAND operation of an adjacent relationship and an inversion relationship in first to fifth means is stored, an adjacent pair of the same phase is extracted from the data after determining phases, and the extracted pair is indicated as a phase-improper portion. With this means, a portion to be corrected can be detected immediately.

In the seventh means, the, threshold value S2 defined as a limit distance which can be resolved only by Levenson type phase shifting method is used in the first to fifth means. The displacement obtained by this means has a higher resolution.

In the eighth means, data of loop-cut adjacent pairs in the first to fifth means is stored, an adjacent pair of the same phase is extracted from the data after determining phases, and the extracted pair is indicated as a phase-improper portion for the designer or a person related to Levenson design, so that a portion to be corrected can easily be detected.

In the ninth means, a distance, which cannot be resolved when phases of an adjacent pair of patterns are the same, is designated as S2, and a distance which is greater than the distance S2 is designated as S3. First, phases of patterns adjacent to each other with the distance S2 or smaller are determined; and thereafter, phases of patterns adjacent to each other with a distance greater than S2 and equal to or smaller than S3 are determined. With this means, Levenson type phase shifting method is applied to isolated patterns.

In the tenth means, when an adjacent relationship of pairs of patterns adjacent to each other within a distance S3 is formed and sorted in a descending order of difficulty of correction in the first, second and fifth means, a minimum distance between adjacent patterns is designated as S2 or smaller as a first key, and the order of difficulty as in the first, second and fifth means is designated as a second key, so that adjacent pairs can be sorted.

In the eleventh means, an adjacent relationship of pairs of patterns adjacent to each other within a distance S3 is formed in the third and fourth means, and an inversion relationship of pairs of patterns adjacent to each other within the distance S2. With this means, phases can be determined irrespective of the easiness of correction, and Levenson type phase shifting method is applied to isolated patterns, resolution of which can be improved.

In the twelfth means, a value of S3 determined to be a critical distance as to whether resolution is used in the ninth to eleventh means, thereby giving a phase difference to most of the pairs, resolution of which can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a flowchart showing a second function of the present invention;

FIG. 4 is a flowchart showing a third function of the present invention;

FIG. 7 is a diagram showing an input layout used in the above embodiment;

FIGS. 8A and 8B are diagrams showing phase determination patterns;

FIG. 22 is a diagram showing a phase-determined result based on the inversion relationship of the fourth embodiment;

FIG. 23 is a diagram showing the phase-determined result and phase-improper portions of the fourth embodiment;

FIG. 25 is a diagram showing an adjacent relationship of the fifth embodiment;

FIG. 26 is a diagram showing a phase-improper portion, when the phase is determined on the basis of the relationship in group 1 according to the fifth embodiment;

FIG. 27 is a diagram showing the inversion relationship and the phase-determined result of the fifth embodiment;

FIG. 28 is a diagram showing the phase-determined result on the basis of the relationship in group 2 according to the fifth embodiment;

FIG. 29 is a diagram showing the phase-determined result and phase-improper portions of the fifth embodiment;

FIG. 30 is a flowchart for explaining a sixth embodiment of the present invention;

FIG. 31 is a diagram showing layout data 2;

FIG. 32 is a diagram showing an adjacent relationship in group A according to the sixth embodiment;

FIG. 33 is a diagram showing an adjacent relationship in group B according to the sixth embodiment;

FIG. 34 is a diagram showing the phase-determined result and a phase-improper portion of the sixth embodiment;

DETAILED DESCRIPTION OF THE PERFERRED EMBODIMENTS

Figure 1:
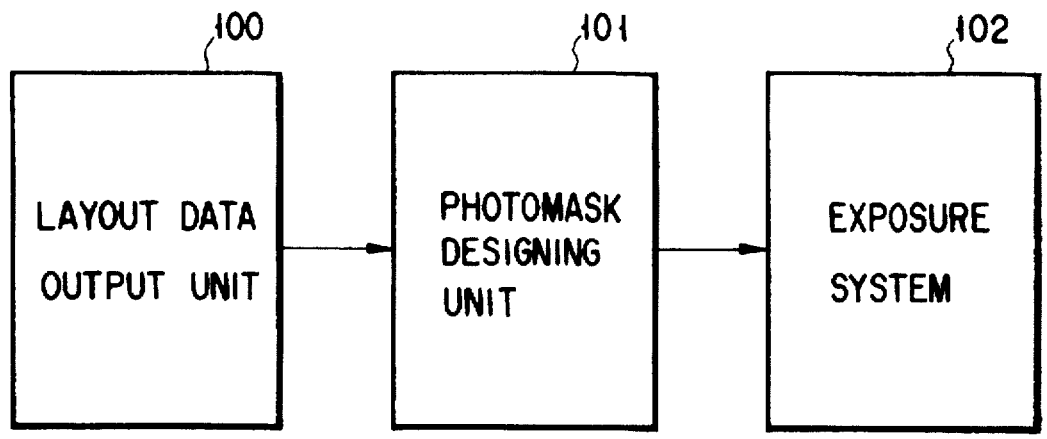
FIG. 1 is a schematic diagram showing a semiconductor manufacturing system to which the present invention is applied.

The present invention can be worked by a semiconductor manufacturing system as shown in FIG. 1, which includes a layout data output unit 100, a photomask designing unit 101 and an exposure system 102. A photomask is designed by the photomask designing unit 101.

With this system, photomask designing of the present invention is performed as in the following embodiments.

(First Embodiment)

Figure 5:
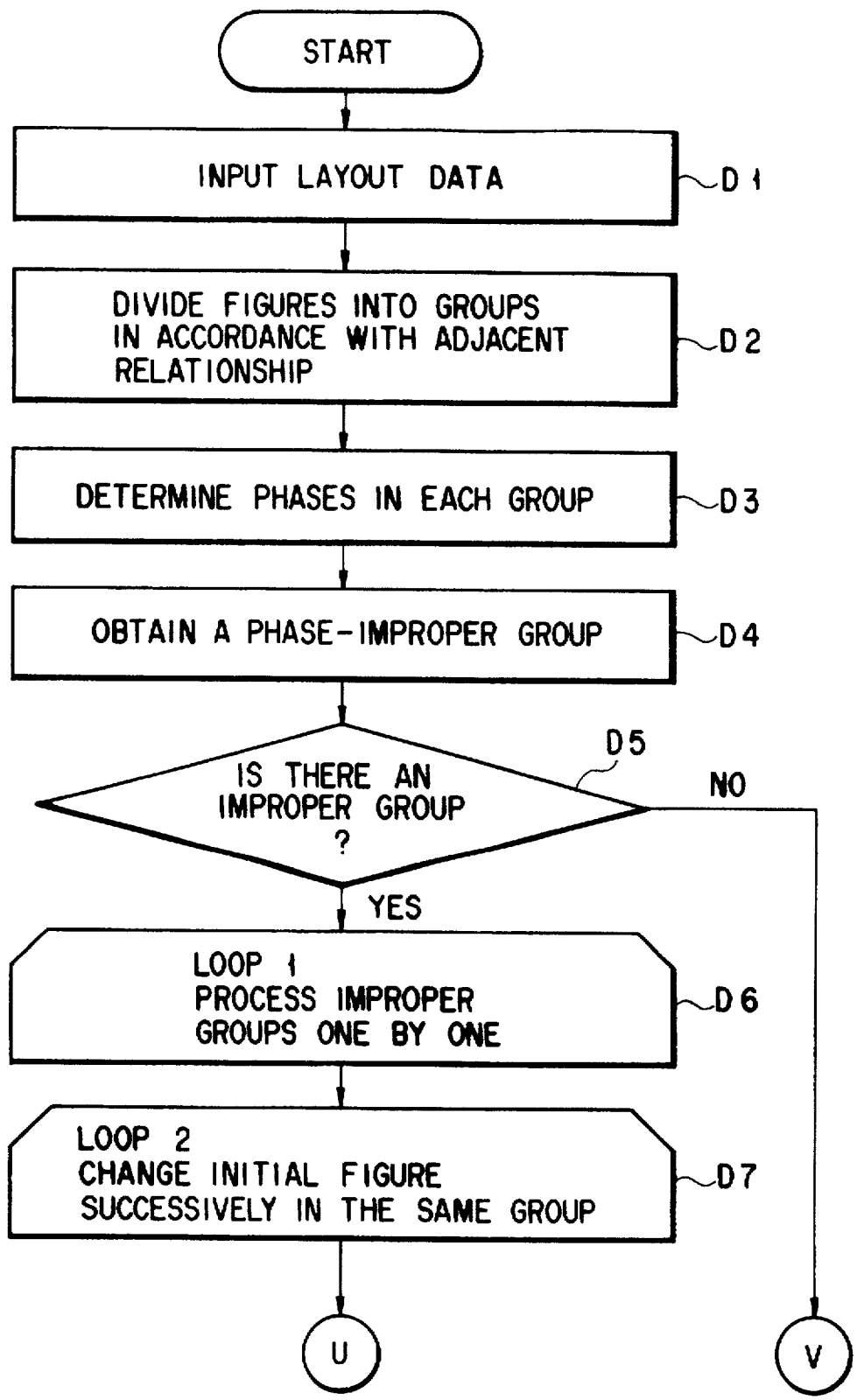
FIG. 5 is a flowchart for explaining a first embodiment of the present invention.
Figure 6:
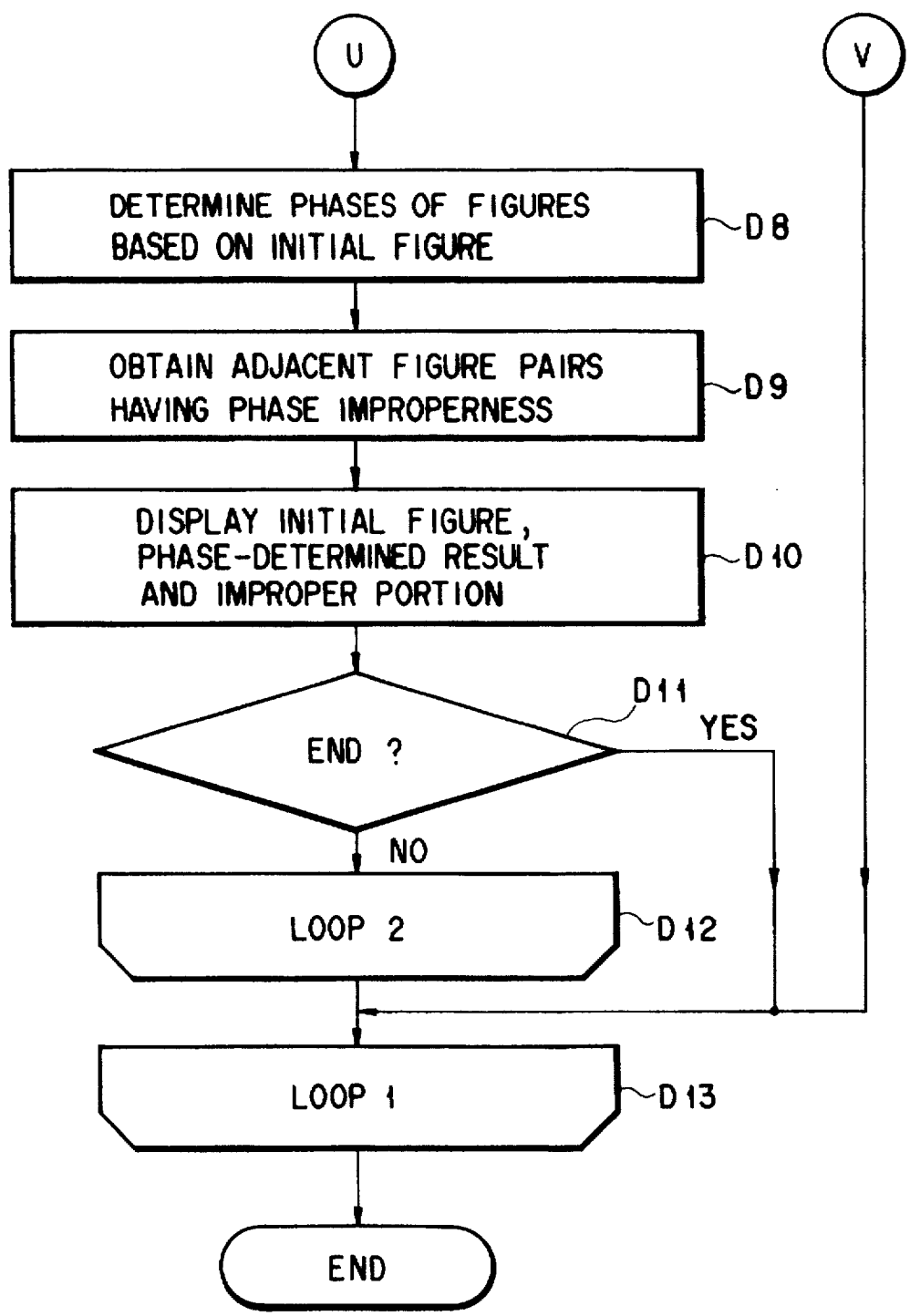
FIG. 6 is a flowchart subsequent to the flowchart shown in FIG. 5.

FIGS. 5 and 6 show designing procedures according to a first embodiment of the present invention. The procedures are executed by a computer. The steps of the procedures will be described below. First, layout data as shown in FIG. 7 is input to the semiconductor manufacturing system of the present invention (Step D1). Figures of a photomask, which are adjacent to one another within a distance R, are divided into groups (Step D2). As a result, two groups are obtained: one consists of figures A, B, C, D, E, F, G, H, I and J, and the other consists of figures K, L and M.

The phases of the figures are determined in each group (Step D3). The phases of the figures K, L and M can be determined without an improper phase, whereas an improper phase exists in the group of A to J. Hence, the group of A to J is obtained as a phase-improper group (Step D4).

Phase improperness means a state where the phases of adjacent figures are the same (both phases are 0° or 180°).

In Step D5, it is checked whether there is at least one improper group (A to J). In this case, since there is one improper group, the flow advances to Step D6. Then, an initial figure in the group is selected (Step D7). In this embodiment, the figure A is selected as an initial figure and given the phase 0° (or 180°) (the same result is obtained in the case of the phase 180°). Then, the phases of the other figures are determined on the basis of the initial figure A (Step D8).

As a result, the patterns as shown in FIG. 8A and 8B are obtained, and pairs of adjacent figures in a phase-improper portion (hereinafter referred to as a phase-improper adjacent figure pair) B-D, F-I, H-I and I-J are obtained (Step D9). The designer is informed of the initial figure, the phase-determined result and the phase-improper portion (Step D10). If the designer judges that the phase improper portion is easy to correct, the process with respect to the group is ended and the procedure advances to a next phase-improper group (in this embodiment, since there is no other phase-improper group, the procedure is ended) (Step D11). If the procedure is not ended, the initial figure is successively changed and the steps D7 to D12 are executed again.

Figure 9A:
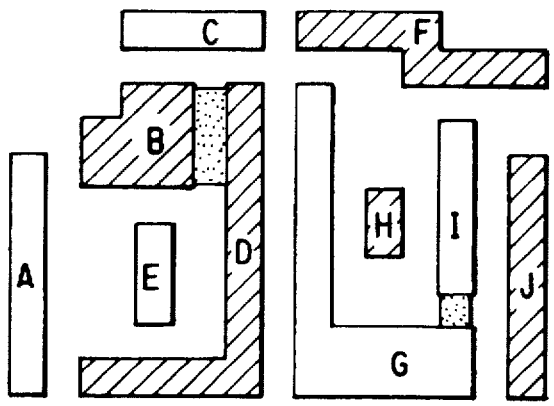
FIGS. 9A and 9B are diagrams showing phase determination patterns.
Figure 10A:
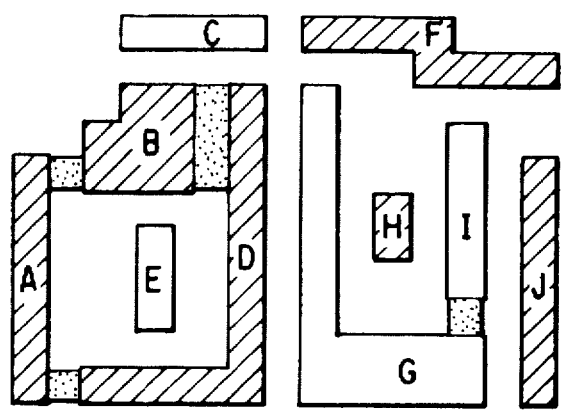
FIGS. 10A and 10B are diagrams showing phase determination patterns.
Figure 9B:
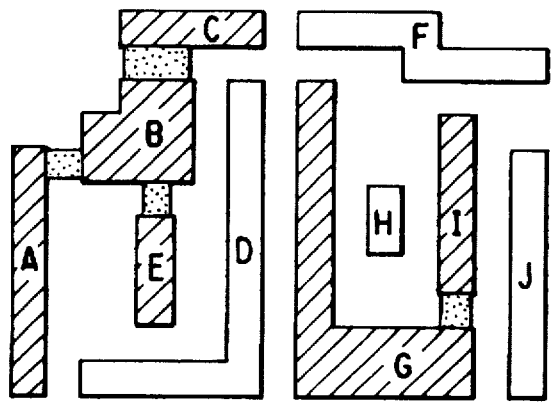
Figure 10B:
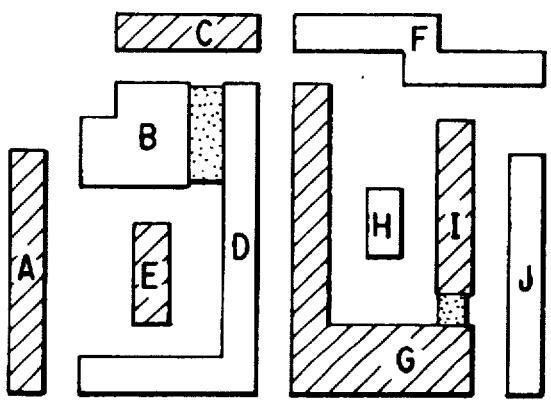
Figure 11A:
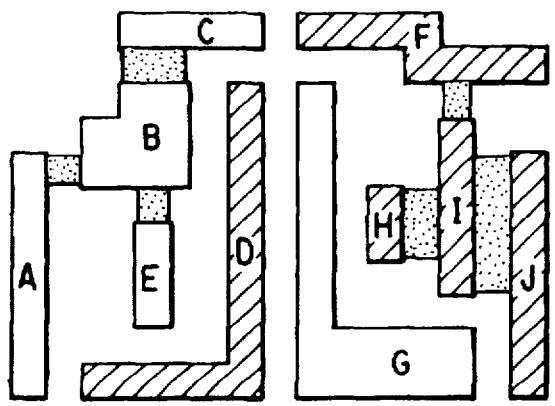
FIGS. 11A and 11B are diagrams showing phase determination patterns.
Figure 12A:
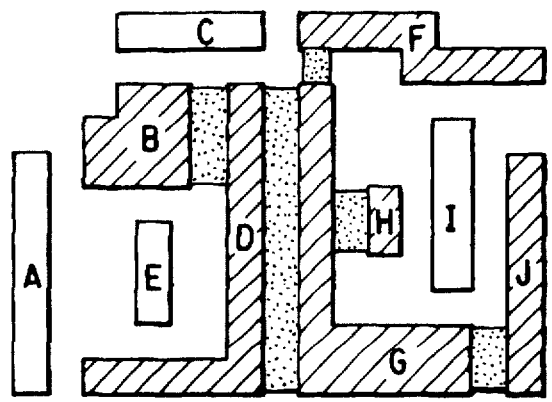
FIGS. 12A and 12B are diagrams showing phase determination patterns.
Figure 11B:
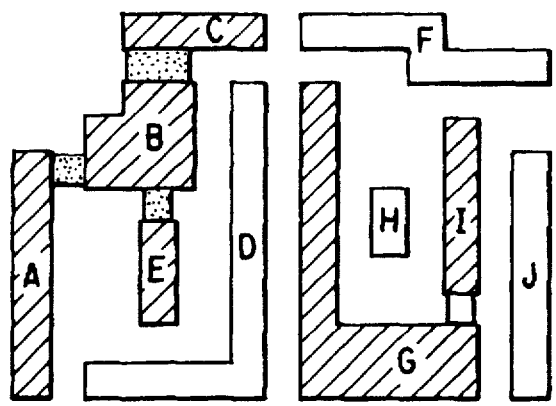
Figure 12B:
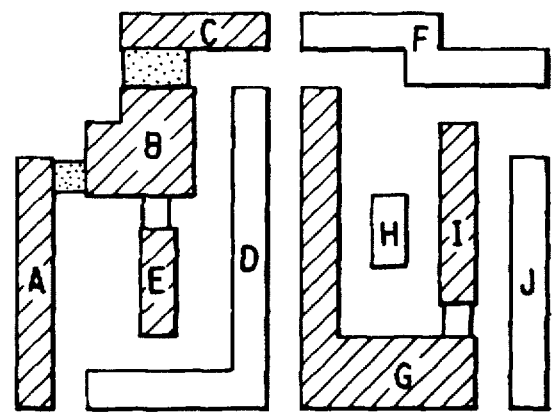

When the initial figure is B, there are five phase-improper adjacent figure pairs A-D, C-D, D-E, D-G and G-I (FIG. 8B). When the initial figure is C, there are two phase-improper adjacent figure pairs B-D and G-I (FIG. 9A). When the initial figure is D, there are four phase-improper adjacent figure pairs A-B, B-C, B-E and G-I (FIG. 9B). When the initial figure is E, there are four phase-improper adjacent figure pairs A-B, A-D, B-D and G-I (FIG. 10A). When the initial figure is F, there are two phase-improper adjacent figure pairs B-D and G-I (FIG. 10B). When the initial figure is G, there are six phase-improper adjacent figure pairs A-B, B-C, B-E, F-I, H-I and I-J (FIG. 11A). When the initial figure is H, there are four phase-improper adjacent figure pairs A-B, B-C, B-E and G-I (FIG. 11B). When the initial figure is I, there are five phase-improper adjacent figure pairs B-D, D-G, F-G, G-H and G-J (FIG. 12A). When the initial figure is J, there are four phase-improper adjacent figure pairs A-B, B-C, B-E and G-I (FIG. 12B).

The above results are shown in the following Table 1.

TABLE 1

| Initial Figure | Phase-improper Adjacent Figure Pairs | Number of Improper Portions |
|---|---|---|
| A | B-D F-I H-I I-J | 4 |
| B | A-D C-D D-E D-G G-I | 5 |
| C | B-D G-I | 2 |
| D | A-B B-C B-E G-I | 4 |
| E | A-B A-D B-D G-I | 4 |
| F | B-D G-I | 2 |
| G | A-B B-C B-E F-I H-I I-J | 6 |
| H | A-B B-C B-E G-I | 4 |
| I | B-D D-G F-G G-H G-J | 5 |
| J | A-B B-C B-E G-I | 4 |

From the phase-determined results of 10 patterns, the designer select one pattern, which he or she thinks is easiest to correct. Then, since there is no other phase-improper group, the procedure is ended.

(Second Embodiment)

Figure 13:
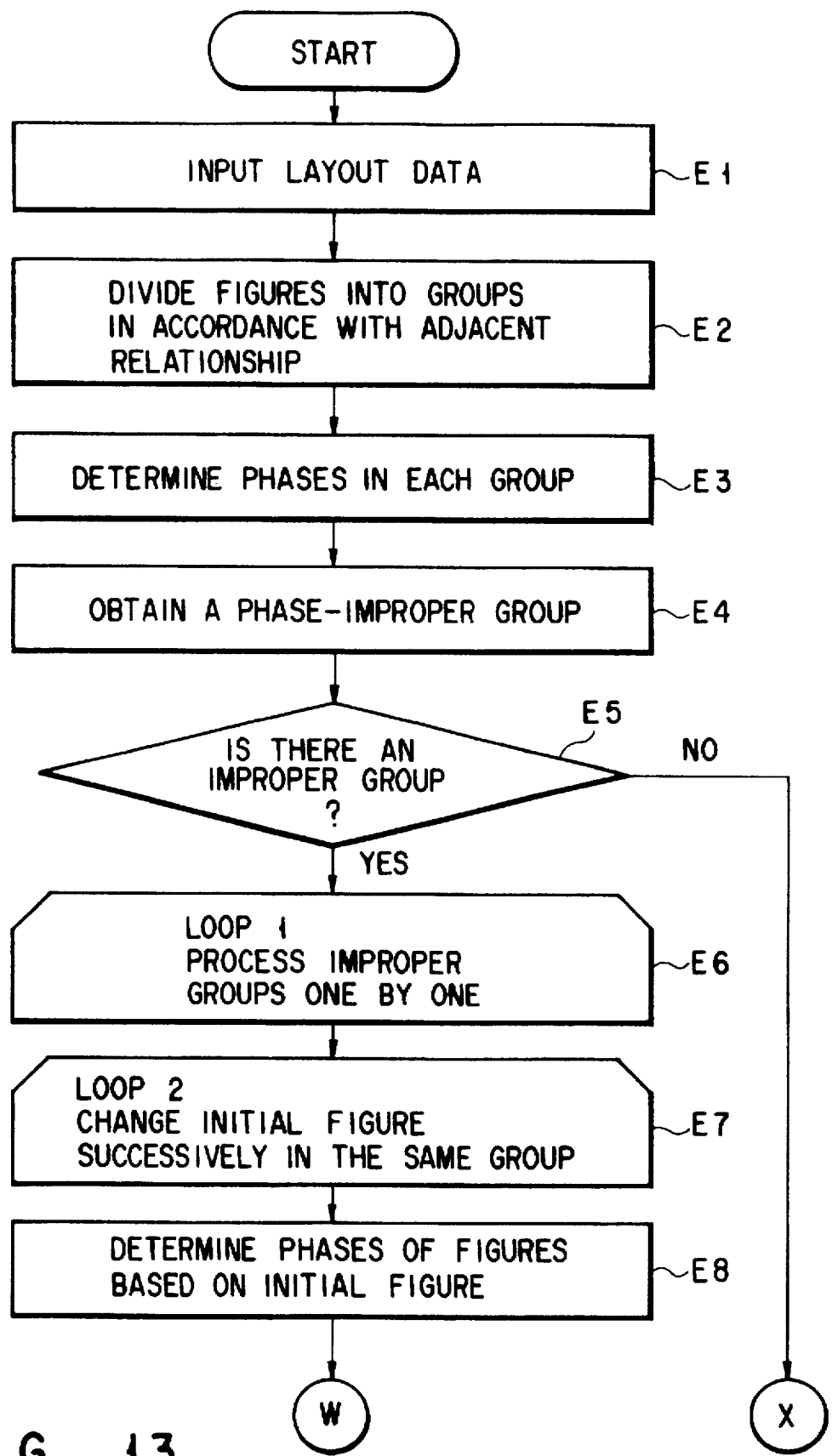
FIG. 13 is a flowchart for explaining a second embodiment of the present invention.
Figure 14:
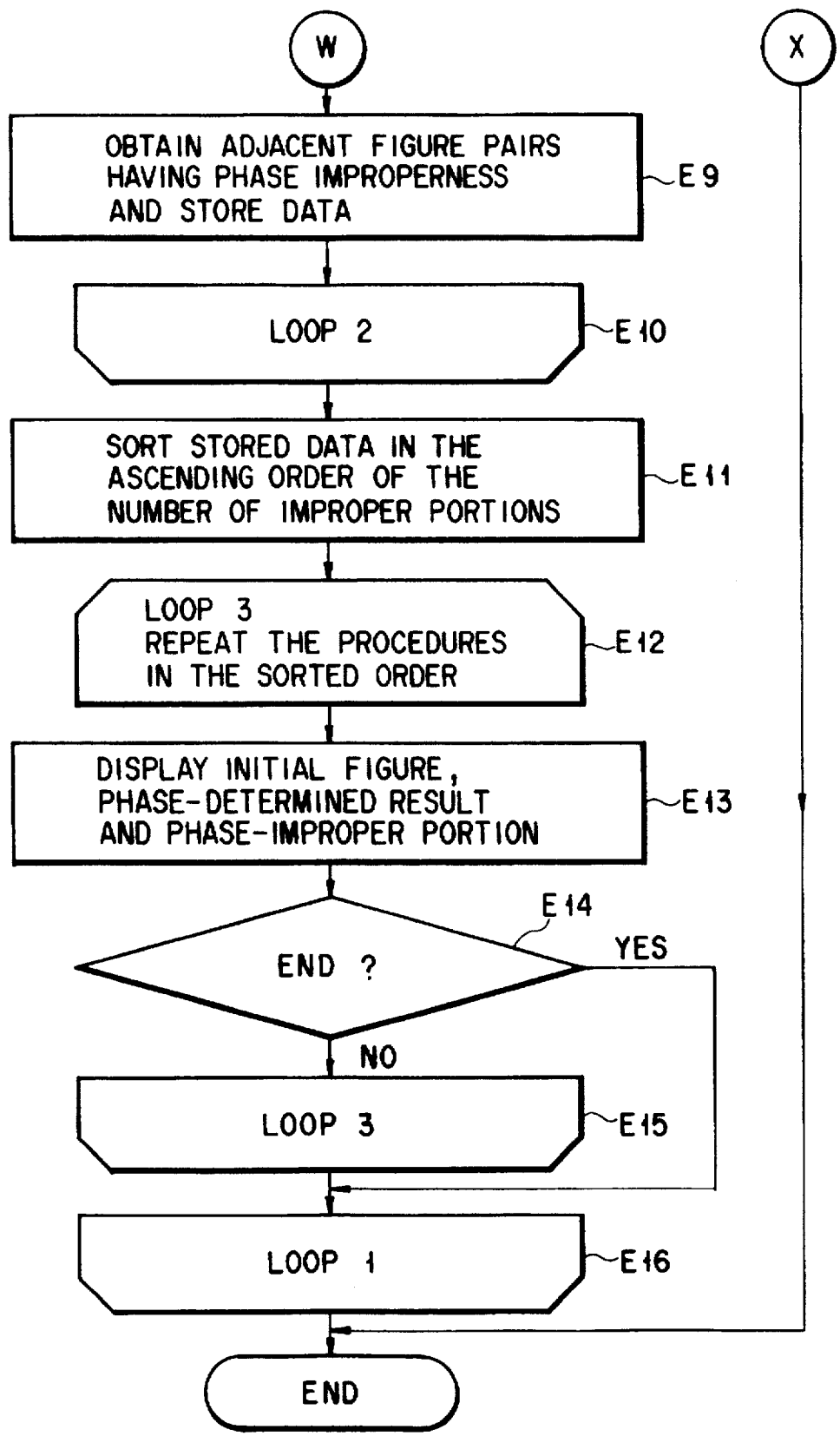
FIG. 14 is a flowchart subsequent to the flowchart shown in FIG. 13.

FIGS. 13 and 14 show designing procedures according to a second embodiment of the present invention. The procedures from inputting layout data shown in FIG. 7 to selecting a figure in an improper group (Steps E1 to E6) are the same as those in the first embodiment (Steps D1 to D6). The subsequent steps will be described. A figure is selected as an initial figure and given the phase 0° (or 180°) Then, the phases of the figures are determined on the basis of the initial figure (Step E7). In this embodiment, the figure A is selected as an initial figure and given the phase 0° (or 180°). Then, the phases of the other figures are determined on the basis of the phase of the initial figure A. As a result, phase-improper portions are detected and data, such as the number of phase-improper portions and the initial figure, is stored in a memory (Steps E8 and E9). Then, the initial figure is successively changed to another one and the same procedures are executed as in the case of the initial figure A (Steps E7 to E10). The results are shown in Table 1 indicated before.

Subsequently, the stored data is sorted in the ascending order of the number of the phase-improper portions (Step E11). The result of the sort is shown in Table 2. The initial figure, the phase-determined result and the phase-improper portion are displayed in the sorted order (Steps E12 and E13). In Steps E14 to E16, if the designer judges that the phase improper portion is easy to correct, the process with respect to the group is ended and the procedure advances to a next phase-improper group (Step E15). In this embodiment, since there is no other phase-improper group, the procedure is ended (Step E16).

TABLE 2

| Order | Initial Figure | Phase-improper Adjacent Figure Pairs | Number of Improper Portions |
|---|---|---|---|
| 1 | C | B–D G–I | 2 |
| 1(2) | F | B–D G–I | 2 |
| 3 | A | B–D F–I H–J I–J | 4 |
| 3(4) | D | A–B B–C B–E G–I | 4 |
| 3(5) | E | A–B A–D B–D G–I | 4 |
| 3(6) | H | A–B B–C B–E G–I | 4 |
| 3(7) | J | A–B B–C B–E G–I | 4 |
| 8 | B | A–D C–D D–E D–G G–I | 5 |
| 8(9) | I | B–D D–G F–G G–H G–J | 5 |
| 10 | G | A–B B–C B–E F–I H–I I–J | 6 |

(Third Embodiment)

Figure 15:
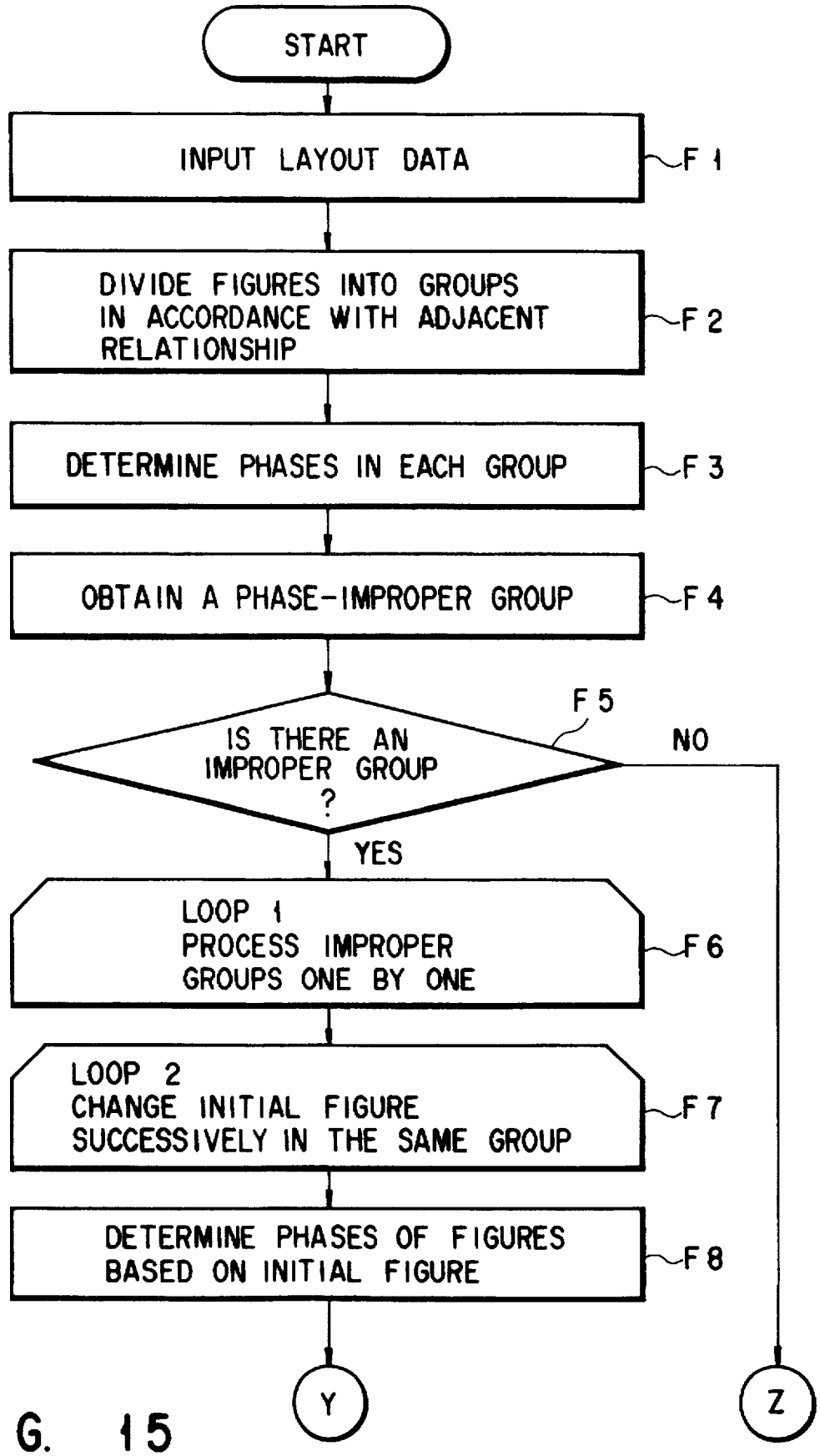
FIG. 15 is a flowchart for explaining a third embodiment of the present invention.
Figure 16:
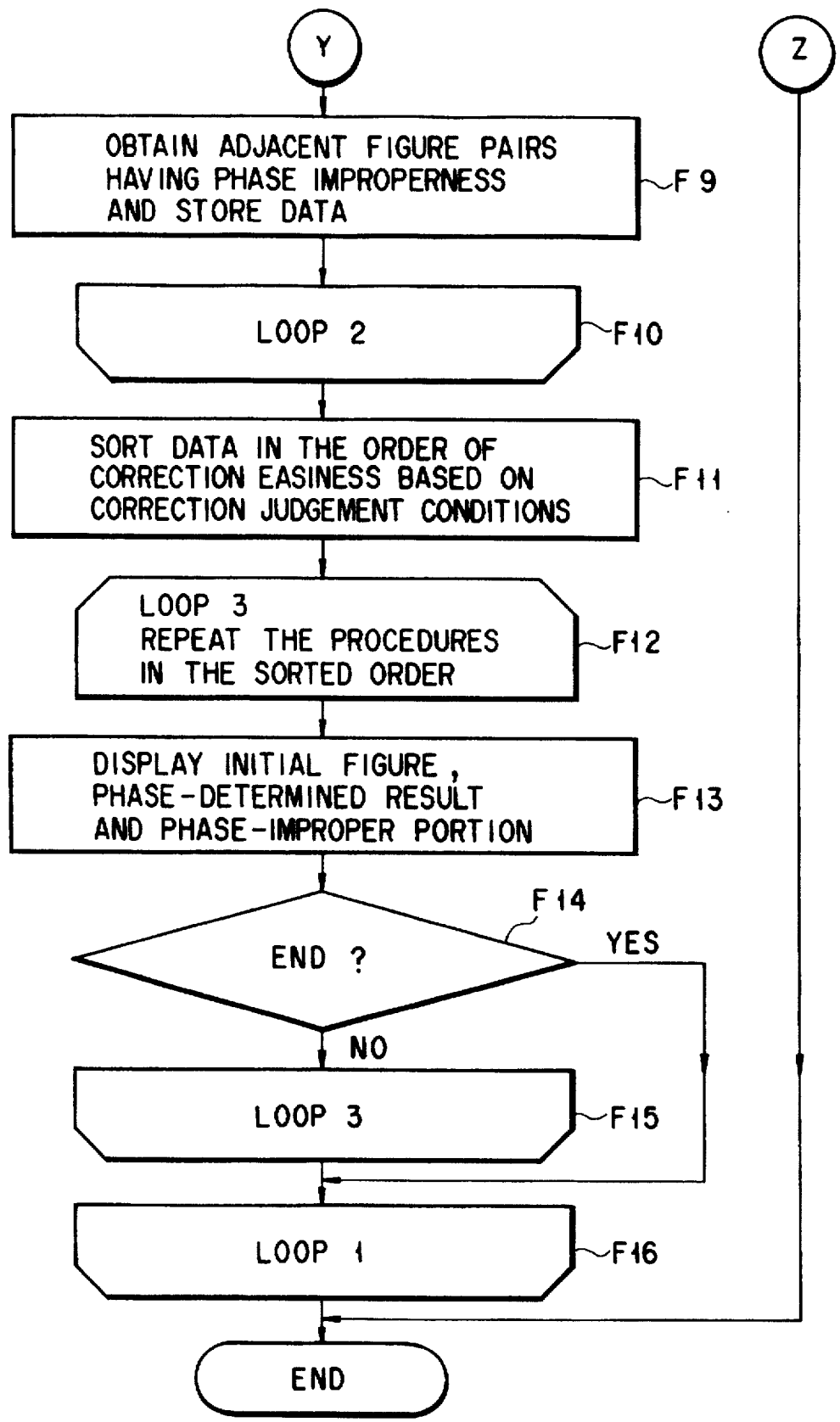
FIG. 16 is a flowchart subsequent to the flowchart shown in FIG. 15.
Figure 17:
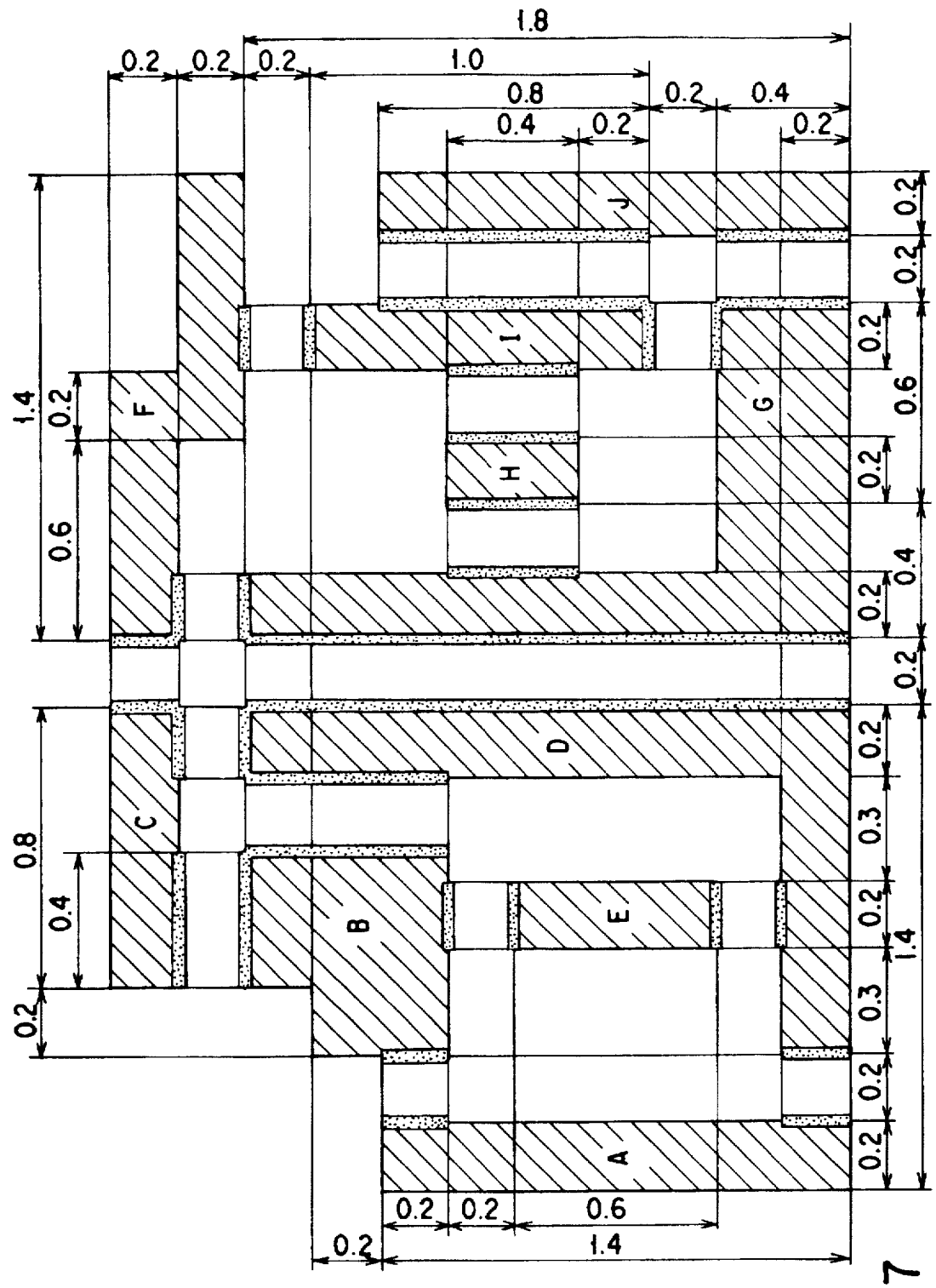
FIG. 17 is a diagram showing an input layout in connection with FIG. 7.

FIGS. 15 and 16 show designing procedures according to a third embodiment of the present invention. The procedures of inputting layout data shown in FIG. 7, obtaining a phase-improper group, selecting a figure in the group as an initial figure and giving the phase 0° (or 180°) to the figure, determining the phases of the figures on the basis of the phase of the initial figure, and storing data, such as the number of phase-improper portions and the initial figure, in a memory (Steps F1 to F10) are the same as those in the second embodiment (Steps E1 to E10). FIG. 17 shows an input layout in which R=0.2 is applied to the dimensions in the phase-improper group (the dimensions are used in the subsequent description). The stored data are compared with one another and evaluated, and sorted in the order of correction easiness based on the comparison and evaluation (Step F11). Correction easiness is defined as follows; that is, of all the pairs of phase-improper adjacent figures, the following pair is defined as being easy to correct: a pair in which the sum of two shortest widths (w2 in FIG. 18, hereinafter referred to as an adjacent plane width) of all the widths perpendicular to the sides of opposing figures located with a distance R or shorter, is relatively great, and the sum of two lengths (S in FIG. 18, hereinafter referred to as an adjacent plane length) of opposing figures located with a distance R is relatively small. The sum of the shortest widths is hereinafter referred to as the sum of adjacent plane widths, and the sum of the two lengths is hereinafter referred to as the sum of adjacent plane lengths.

Procedures of comparison and evaluation will be now described in detail. First, the data stored in the memory is sorted in the ascending order of the number of the phase-improper portions. The result of the sort is shown in Table 2.

Then, of all the cases of initial figures having the same number of phase-improper portions, the cases of the same phase-improper portions are treated as one. In this embodiment, the cases of the initial figures C and F are treated as one and the cases of the initial FIGS. D, H and J are treated as one. The figures having the same number of (at least one) phase-improper portion are subjected to the calculations as will be described below. In the following, the cases of 4 and 5 phase-improper portions are described as examples.

First, the cases of the initial FIG. A, (D, H, J) and E, in which there are four phase-improper portions, will be described. A calculation is executed with respect to the initial FIG. A. The phase-improper portions are B-D, F-I, H-J and I-J. Regarding the portion B-D, the adjacent plane width and length with respect to the figure B are respectively 0.2 and 0.6, while the adjacent plane width and length with respect to the FIG. D are 0.4 and 0.6. The sum of the adjacent plane widths is 0.6 and the sum of the adjacent plane lengths is 1.2. Regarding the portion F-I, the adjacent plane width and length with respect to the FIG. F are respectively 1.0 and 0.2, while the adjacent plane width and length with respect to the FIG. I are 0.2 and 0.2. The sum of the adjacent plane widths is 1.2 and the sum of the adjacent plane lengths is 0.4. Regarding the portion H-I, the adjacent plane width and length with respect to the figure H are respectively 0.2 and 0.4, while the adjacent plane width and length with respect to the FIG. I are 0.2 and 0.4. The sum of the adjacent plane widths is 0.4 and the sum of the adjacent plane lengths is 0.8. Regarding the portion I-J, the adjacent plane width and length with respect to the FIG. I are respectively 0.2 and 0.8, while the adjacent plane width and length with respect to the FIG. J are 0.2 and 0.8. The sum of the adjacent plane widths is 0.4 and the sum of the adjacent plane lengths is 1.6. The sums of the adjacent plane widths of the above four improper portions and the sums of the adjacent plane lengths of the above four improper portion are respectively added together, resulting in the sum of widths 2.6 and the sum of the lengths 4.0. These values are used in comparison. A calculation is executed with respect to the initial figures D, H and J. The phase-improper portions are A-B, B-C, B-E and G-I. Regarding the portion A-B, the adjacent plane width and length with respect to the FIG. A are respectively 0.6 and 0.2, while the adjacent plane width and length with respect to the FIG. B are 0.2 and 0.2. The sum of the adjacent plane widths is 0.8 and the sum of the adjacent plane lengths is 0.4. Regarding the portion B-C, the adjacent plane width and length with respect to the FIG. B are respectively 0.2 and 0.4, while the adjacent plane width and length with respect to the FIG. C are 0.6 and 0.4. The sum of the adjacent plane widths are 0.8 and the sum of the adjacent plane lengths are 0.8. Regarding the portion B-E, the adjacent plane width and length with respect to the FIG. B are respectively 0.6 and 0.2, while the adjacent plane width and length with respect to the FIG. E are 0.6 and 0.2. The sum of the adjacent plane widths is 1.2 and the sum of the adjacent plane lengths is 0.4. Regarding the portion G-I, the adjacent plane width and length with respect to the FIG. G are respectively 1.0 and 0.2, while the adjacent plane width and length with respect to the FIG. I are 0.4 and 0.2. The sum of the adjacent plane widths is 1.4 and the sum of the adjacent plane lengths is 0.4. The sums of the adjacent plane widths of the above four improper portions and the sums of the adjacent plane lengths of the above four improper portions are respectively added together, resulting the sum of widths 4.2 and the sum of the lengths 2.0. These values are used in comparison. Then, a calculation is executed with respect to the initial FIG. E. The phase-improper portions are A-B, A-D, B-D and G-I. Regarding the portion A-B, the adjacent plane width and length with respect to the FIG. A are respectively 0.6 and 0.2, while the adjacent plane width and length with respect to the FIG. B are 0.2 and 0.2. The sum of the adjacent plane widths is 0.8 and the sum of the adjacent plane lengths is 0.4. Regarding the portion A-D, the adjacent plane width and length with respect to the FIG. A are respectively 1.0 and 0.2, while the adjacent plane width and length with respect to the FIG. D are 0.2 and 0.2. The sum of the adjacent plane widths is 1.2 and the sum of the adjacent plane lengths is 0.4. Regarding the portion B-D, the adjacent plane width and length with respect to the FIG. B are respectively 0.2 and 0.6, while the adjacent plane width and length with respect to the FIG. D are 0.4 and 0.6. The sum of the adjacent plane widths is 0.6 and the sum of the adjacent plane lengths is 1.2. Regarding the portion G-I, the adjacent plane width and length with respect to the FIG. G are respectively 1.0 and 0.2, while the adjacent plane width and length with respect to the FIG. I are 0.4 and 0.2. The sum of the adjacent plane widths is 1.4 and the sum of the adjacent plane lengths is 0.4. The sums of the adjacent plane widths of the above four improper portions and the sums of the adjacent plane lengths of the above four improper portions are respectively added together, resulting in the sum of widths 4.0 and the sum of the lengths 2.4. These values are used in comparison. Based on the above results of the addition, the data is sorted in the ascending order of the sum of the adjacent plane widths as a first key and in the order of the descending order of the sum of the adjacent plane lengths as a second key. As a result, the order of (D, H, I)→E→A is obtained.

Second, the cases of the initial figures B and I, in which there are five phase-improper portions, will be described. A calculation is executed with respect to the initial FIG. B. The phase-improper portions are A-D, C-D, D-E, D-G and G-I. Regarding the portion A-D, the adjacent plane width and length with respect to the FIG. A are respectively 1.0 and 0.2, while the adjacent plane width and length with respect to the FIG. D are 0.2 and 0.2. The sum of the adjacent plane widths is 1.2 and the sum of the adjacent plane lengths is 0.4. Regarding the portion C-D, the adjacent plane width and length with respect to the FIG. C are respectively 1.8 and 0.2, while the adjacent plane width and length with respect to the FIG. D are 0.2 and 0.2. The sum of the adjacent plane widths is 2.0 and the sum of the adjacent plane lengths is 0.4. Regarding the portion D-E, the adjacent plane width and length with respect to the FIG. D are respectively 0.6 and 0.2, while the adjacent plane width and length with respect to the FIG. E are 0.2 and 0.2. The sum of the adjacent plane widths is 0.8 and the sum of the adjacent plane lengths is 0.4. Regarding the portion D-G, the adjacent plane width and length with respect to the FIG. D are respectively 0.2 and 1.8, while the adjacent plane width and length with respect to the FIG. G are 0.2 and 1.8. The sum of the adjacent plane widths is 0.4 and the sum of the adjacent plane lengths is 3.6. Regarding the portion G-I, the adjacent plane width and length with respect to the FIG. G are respectively 1.0 and 0.2, while the adjacent plane width and length with respect to the FIG. I are 0.4 and 0.2. The sum of the adjacent plane widths is 1.4 and the sum of the adjacent plane lengths is 0.4. The sums of the adjacent plane widths of the above five improper portions and the sums of the adjacent plane lengths of the five improper portion are respectively added together, resulting in the sum of widths 5.8 and the sum of the lengths 5.2. These values are used in comparison. Then, a calculation is executed with respect to the initial FIG. I. The phase-improper portions are B-D, D-G, F-G, G-H and G-J. Regarding the portion B-D, the adjacent plane width and length with respect to the FIG. B are respectively 0.2 and 0.6, while the adjacent plane width and length with respect to the FIG. D are 0.4 and 0.6. The sum of the adjacent plane widths is 0.6 and the sum of the adjacent plane lengths is 1.2. Regarding the portion D-G, the adjacent plane width and length with respect to the FIG. D are respectively 0.2 and 1.8, while the adjacent plane width and length with respect to the FIG. G are 0.2 and 1.8. The sum of the adjacent plane widths is 0.4 and the sum of the adjacent plane lengths is 3.6. Regarding the portion F-G, the adjacent plane width and length with respect to the FIG. F are respectively 1.8 and 0.2, while the adjacent plane width and length with respect to the FIG. G are 0.2 and 0.2. The sum of the adjacent plane widths is 2.0 and the sum of the adjacent plane lengths is 0.4. Regarding the portion G-H, the adjacent plane width and length with respect to the FIG. G are respectively 0.2 and 0.4, while the adjacent plane width and length with respect to the FIG. H are 0.2 and 0.4. The sum of the adjacent plane widths is 0.4 and the sum of the adjacent plane lengths is 0.8. Regarding the portion G-J, the adjacent plane width and length with respect to the FIG. G are respectively 0.2 and 0.4, while the adjacent plane width and length with respect to the FIG. J are 1.0 and 0.4. The sum of the adjacent plane widths is 1.2 and the sum of the adjacent plane lengths is 0.8. The sums of the adjacent plane widths of the above five cases and the sums of the adjacent plane lengths of the five cases are respectively added together, resulting in the sum of widths 4.6 and the sum of the lengths 6.8. These values are used in comparison. Based on the above results of the addition, the data is sorted in the ascending order of the sum of the adjacent plane widths as a first key and in the order of the descending order of the sum of the adjacent plane lengths as a second key. As a result, the order of B→I is obtained. The above calculations are shown in Table 3.

TABLE 3

| Initial Figure | Four Phase-Improper Portion | | | | |
|---|---|---|---|---|---|
| | Number | | | | |
| | 1 | 2 | 3 | 4 | Sum |
| A | 0.6/1.2(B–D) | 1.2/0.4(F–I) | 0.4/0.8(H–I) | 0.4/1.6(I–J) | 2.6/4.0 |
| D, H, J | 0.8/0.4(A–B) | 0.8/0.8(B–C) | 1.2/0.4(B–E) | 1.4/0.4(G–I) | 4.2/2.0 |
| E | 0.8/0.4(A–B) | 1.2/0.4(A–D) | 0.6/1.2(B–D) | 1.4/0.4(G–I) | 4.0/2.4 |

| Initial Figure | Five Phase-Improper Portion | | | | | |
|---|---|---|---|---|---|---|
| | Number | | | | | |
| | 1 | 2 | 3 | 4 | 5 | Sum |
| B | 1.2/0.4(A–D) | 2.0/0.4(C–D) | 0.8/0.4(D–E) | 0.4/3.6(D–G) | 1.4/0.4(G–I) | 5.8/5.2 |
| I | 0.6/1.2(B–D) | 0.4/3.6(D–G) | 2.0/0.4(F–G) | 0.4/0.8(G–H) | 1.2/0.8(G–J) | 4.6/6.8 |

Sum of Adjacent Plane Width/Sum of Adjacent Plane Lengths (Adjacent Figure Pair)

The final order is shown in Table 4. The designer is informed of the order of (C,F)→(D,H,J)→E→A→B→I→G, the phase-determined result and the phase-improper portions

TABLE 4

| Order | Initial Figure | Number of Improper Portions | Sum of Adjacent Plane Widths | Sum of Adjacent Plane Lengths |
|---|---|---|---|---|
| 1 | C, F | 2 | — | — |
| 2 | D, H, J | 4 | 4.2 | 2.0 |
| 3 | E | 4 | 4.0 | 2.4 |
| 4 | A | 4 | 2.6 | 4.0 |
| 5 | B | 5 | 5.8 | 5.2 |
| 6 | I | 5 | 4.6 | 6.8 |
| 7 | G | 6 | — | — |

Figure 2:
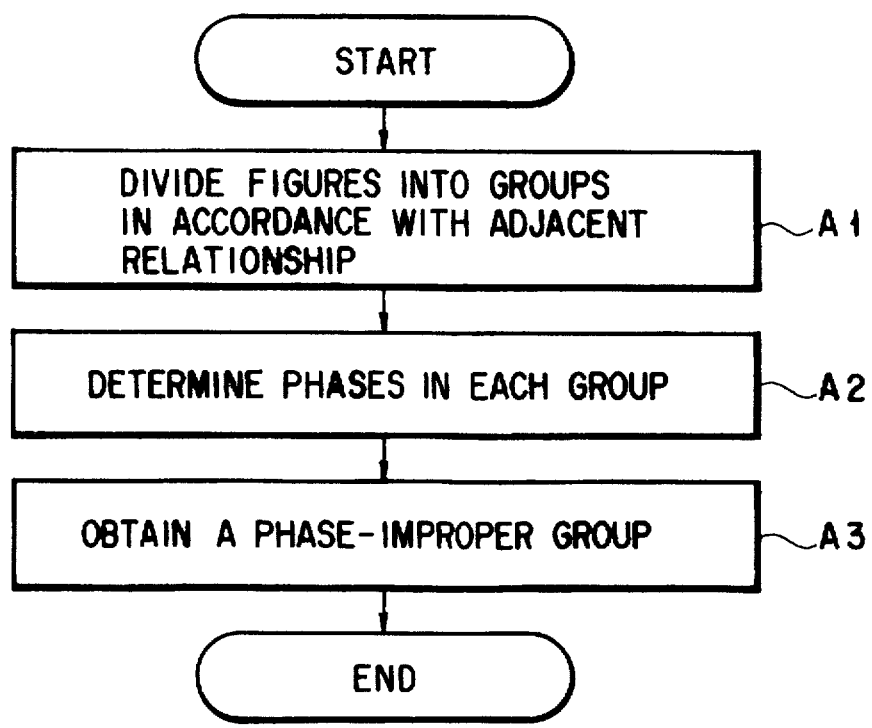
FIG. 2 is a flowchart showing a first function according to a principle of the present invention.
Figure 18:
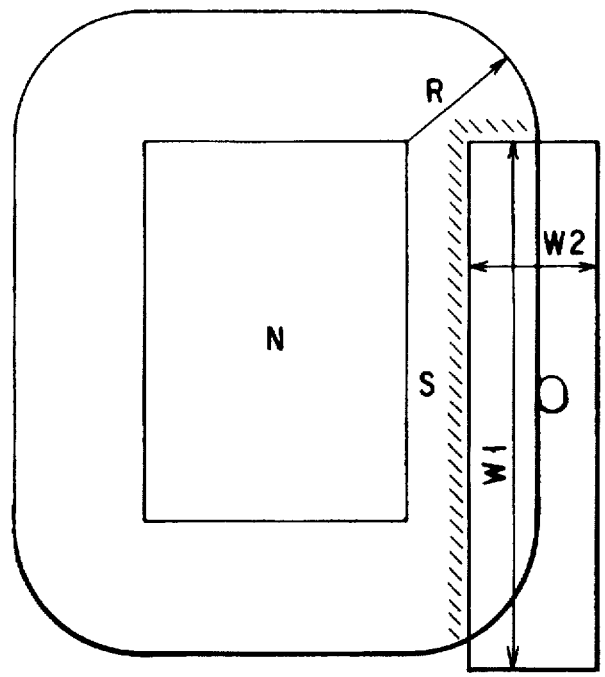
FIG. 18 is an enlarged diagram showing a main part of the mask pattern.

The drawings, which have been referred to above, have the following relationships. FIGS. 2 to 4 are flowcharts showing first to third functions of the present invention. FIGS. 5 and 6 are flowcharts for explaining the system used in the first embodiment. FIG. 7 shows an input layout used in this embodiment, in which figures A to M correspond to transmitting portions of a mask. A symbol "R" denotes a width which can be resolved only by use of a Levenson type phase shifter. The widths of the other portions can be resolved without a Levenson type phase shifter. FIGS. 8A, 8b to 12A, 12B are diagrams showing phase determination patterns in the cases of the respective initial figures in the phase-improper group shown in FIG. 7. FIG. 17 shows an input layout in which R=0.2 is applied to the dimensions in the phase-improper group. FIG. 18 shows an adjacent plane length S and adjacent plane widths W1 and W2.

As described above, the principle of the present invention is applicable to a method for designing a photomask, which is used in photolithography using partially coherent incident light, the photomask including a plurality of transparent regions and a phase shifter for providing the incident light transmitting through the transparent regions with a phase difference. With the present invention, since a phase determination pattern, which is easy to correct, can be found efficiently, a semiconductor device can be designed efficiently and the manufacturing cost can be reduced.

Embodiments according to another principle of the present invention will now be described.

(Fourth Embodiment)

Figure 19:
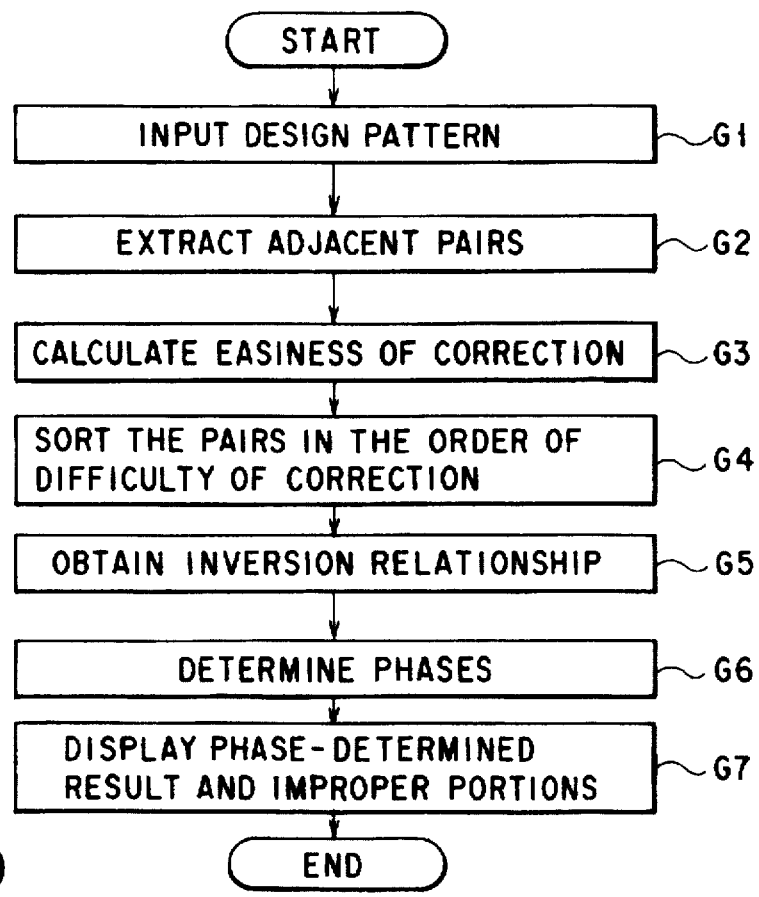
FIG. 19 is a flowchart for explaining a fourth embodiment according to another principle of the present invention.
Figure 20:
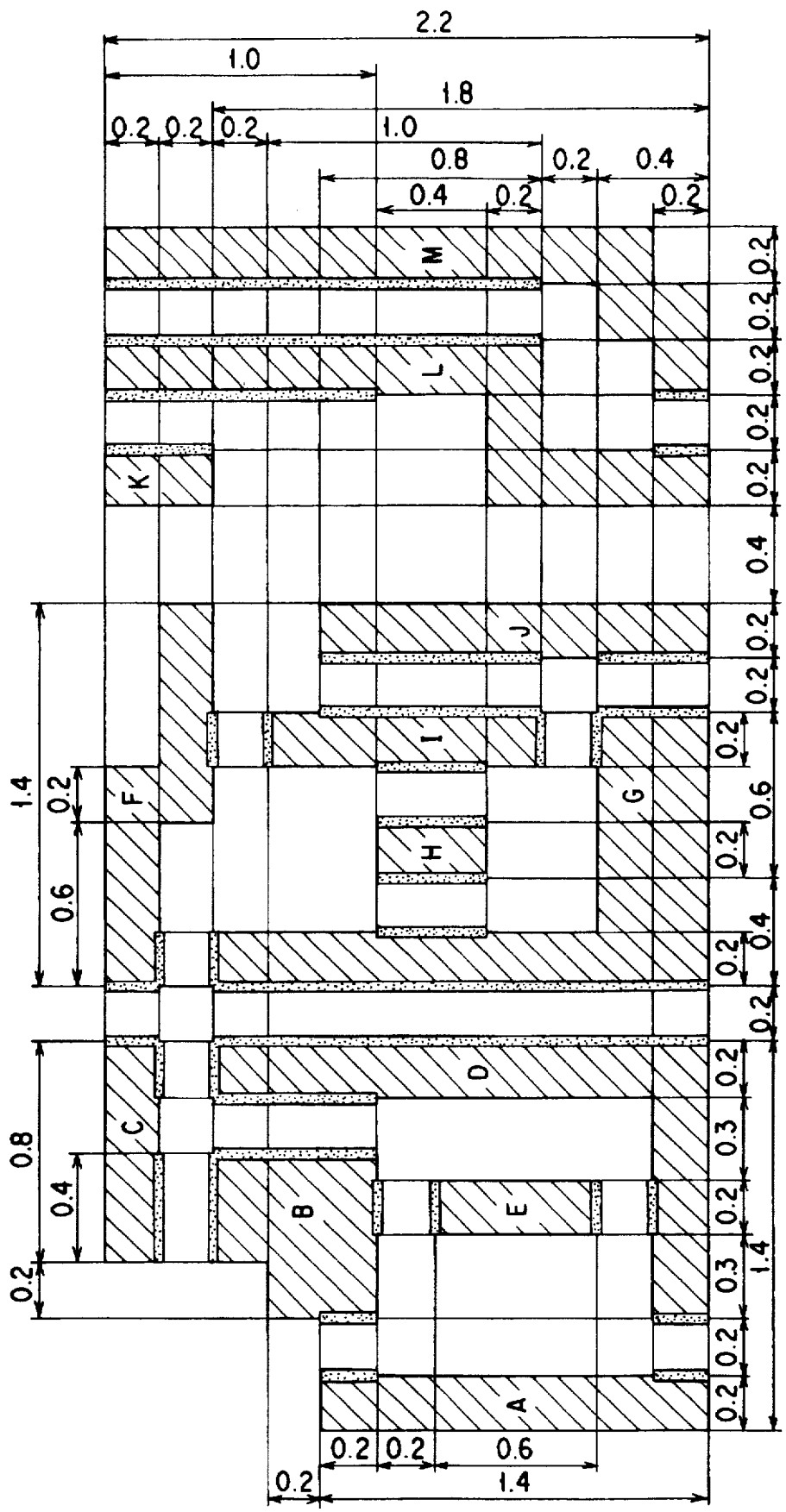
FIG. 20 is a diagram showing layout data 1.

FIG. 19 is a flowchart for explaining this embodiment. First, layout data shown in FIG. 20 is input (Step G1). All adjacent pairs, which are adjacent to one another with a distance S2 (0.2 µm) or smaller, are extracted (Step G2). The adjacent pairs are A-B, A-D, B-C, B-E, B-D, C-D, C-F, D-E, D-G, F-G, F-I, G-H, G-I, G-J, H-I, I-J, K-L and L-M. It is determined that the longer the length of each of the planes of adjacent pairs, the more difficult the correction. The length is hereinafter referred to as the adjacent plane length. The pairs are sorted in the descending order of the adjacent plane length (Steps G3 and G4). The adjacent plane length in each adjacent pair and the sorted order are shown in Table 5.

TABLE 5

| Order | Adjacent Pair | Adjacent Plane Length |
|---|---|---|
| 1 | D–G | 1.8 |
| 2 | L–M | 1.6 |
| 3 | I–J | 0.8 |
| 4 | B–D | 0.6 |
| 5 | K–L | 0.4 |
| 6 | B–C | 0.4 |
| 7 | G–H | 0.4 |
| 8 | G–J | 0.4 |
| 9 | H–I | 0.4 |
| 10 | A–B | 0.2 |
| 11 | A–D | 0.2 |
| 12 | B–E | 0.2 |
| 13 | C–D | 0.2 |
| 14 | C–F | 0.2 |
| 15 | D–E | 0.2 |
| 16 | F–G | 0.2 |
| 17 | F–I | 0.2 |
| 18 | G–I | 0.2 |

Then, an inversion relationship is obtained in the sorted order (Step G5). A method for obtaining the inversion relationship will now be described in detail. The following is a rule for obtaining an inversion relationship on the assumption that the sorted adjacent pairs are successively processed. In summary, a loop portion in a graph of an adjacent relationship is cut in the following manner. Therefore, correction of an improper portion can be simplified by making the cut portion easy to correct.

(1) If neither of an adjacent pair of figures belongs to any group, a new group is produced, the figures of the pair are connected with each other and the figures are incorporated in the inversion relationship in the group.

(2) If both of an adjacent pair of figures belong to the same group, they are not incorporated in the inversion relationship of the group (loop cut).

(3) If one of an adjacent pair of figures does not belong to any group, while the other one belongs to an existing group, the figures of the pair are connected with each other, the pair is incorporated in the inversion relationship of the existing group.

(4) If one of an adjacent pair of figures belongs to a group different from that of the other, the groups of the figures are combined to provide a new group or absorbed to one another group, the figures of the pair are connected with each other and the figures of the pair are incorporated in the inversion relationship of the new group.

Figure 21:
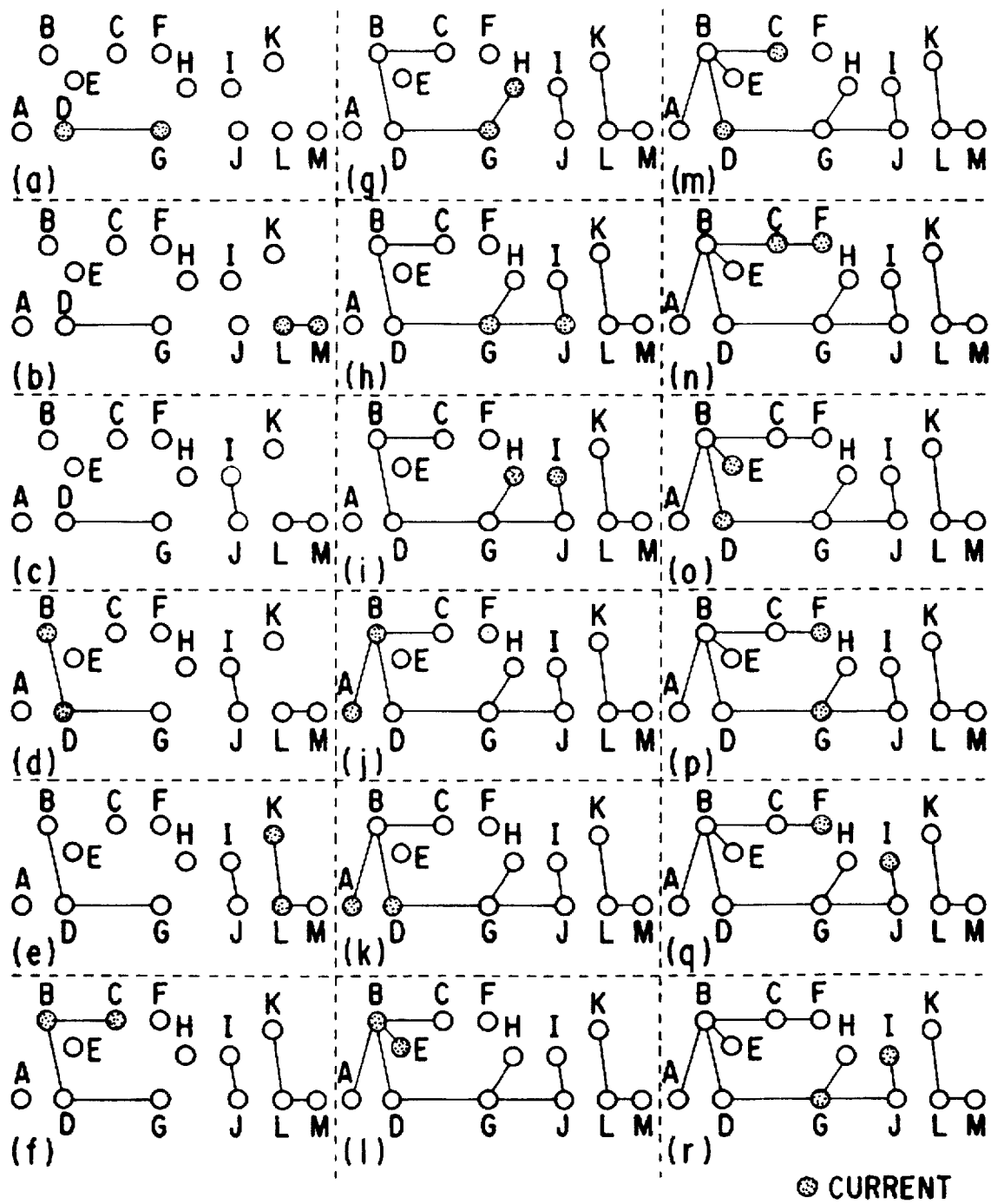
FIG. 21 is a diagram showing a method for producing an inversion relationship according to the fourth embodiment.

Referring to the first sorted pair D-G, since no group exists at first, the figures D and G are connected with each other, thereby producing a new group, as shown in a graph (a) of FIG. 21. Referring to the pair L-M, since the figures L and M do not belong to any group, the figures L and M are connected with each other, thereby producing another group (a graph (b) of FIG. 21). Referring to the pair I-J, since neither the FIG. I nor J belongs to any group, the FIGS. I and J are connected with each other, thereby producing still another group (a graph (c) of FIG. 21). Referring to the pair B-D, since the figure D belongs to the group of the pair D-G and the FIG. B does not belong to any group, the FIG. B is connected to the FIG. D to be incorporated in the group of the pair D-G (a graph (d) of FIG. 21). Then, the pairs K-L, B-C and H-G are consecutively processed. Referring to these pairs, since one of the figures of each pair belongs to an existing group, the figures of the pair are connected with each other and incorporated in the existing group (graphs (e), (f) and (g) of FIG. 21). Referring to the pair G-J, since the figures G and J belong to different groups, the figures of the pair are connected with each other, the groups are collected into one group (a graph (h) of FIG. 21). Referring to the pair H-I, since the figures H and I belong to the same group, they are not connected, i.e., "loop cut" is executed (a graph (i) of FIG. 21). Referring to the pair A-B, since the FIG. B belongs to an existing group, the FIG. A is connected to the FIG. B and incorporated in the group of the FIG. B (a graph (j) of FIG. 21). Referring to the pair A-D, since the figures A and D belong to the same group, "loop cut" is executed (a graph (k) of FIG. 21). Referring to the pair B-E, since the FIG. B belongs to an existing group, the FIG. E is connected to the FIG. B and incorporated in the group of the FIG. B (a graph (1) of FIG. 21). Referring to the pair C-D, since the figures C and D belong to the same group, i.e., "loop cut" is executed (a graph (m) of FIG. 21). Referring to the pair C-F, since the FIG. C belongs to an existing group, the FIG. F is connected to the FIG. C and incorporated in the group of the FIG. C (a graph (n) of FIG. 21). Referring to the pairs D-E, F-G, F-I and G-I, since both the figures in each pair belong to the same group, "loop cut" is executed (graphs (o), (p), (q) and (r) of FIG. 21). The graph (r) thus obtained shows the inversion relationship.

Based on the inversion relationship, the phases are determined, such that the phases of adjacent figures are opposite (Step G6). The result is shown in FIG. 22.

Table 6 shows the pairs of figures, which have been subjected to "loop cut". Pairs of the same phase are extracted from the pairs shown in Table 6, and displayed (FIG. 23).

TABLE 6

| Adjacent Pair | Phase Data |
| --- | --- |
| H-I | 0—180 |
| A-D | 0—0 |
| C-D | 0—0 |
| D-E | 0—0 |
| F-G | 180—180 |
| F-I | 180—180 |
| G-I | 180—180 |

(Fifth Embodiment)

Figure 24:
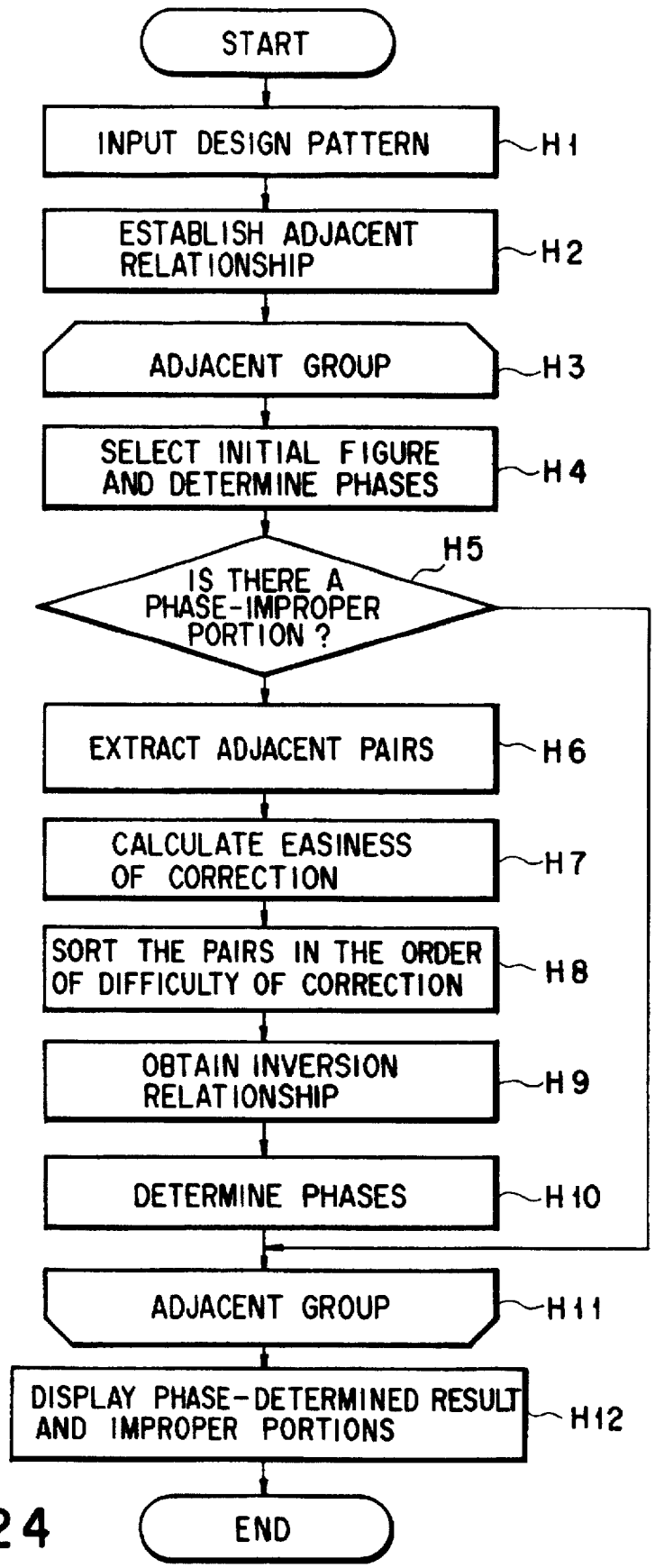
FIG. 24 is a flowchart for explaining a fifth embodiment of the present invention.

FIG. 24 is a flowchart for explaining this embodiment. First, layout data shown in FIG. 20 is input (Step H1). All pairs of adjacent figures, which are adjacent to one another with a distance S2 (0.2 μm) or smaller, are extracted and an adjacent relationship is established (Step H2). FIG. 25 is a graph showing the relationship. As shown in FIG. 25, a group (a group 1) consisting of the figures A, B, C, D, E, F, G, H, I and J and a group (a group 2) consisting of the figures K, L and M are produced. Phases are determined in each group (Steps H3 to H11). First, an initial figure is selected from the group 1. In this embodiment, the FIG. A is selected as an initial figure and given the phase 0° (Step H4). Subsequently, the phases of the figures are determined on the basis of the adjacent relationship as follows. The FIG. B is given the phase 180° i.e., the phase opposite to that of the FIG. A. The FIG. C is given the phase 0°, i.e., the phase opposite to that of the FIG. B. The FIG. D is given the phase 180°, i.e., the phase opposite to that of the FIG. C. At this time, since the phases of the figures B and D are the same, the portion B-D is determined to be phase-improper (FIG. 26). Then, the phases in the group are initialized and all the adjacent pairs of figures in the group are extracted (Steps H5 and H6). It is determined that the longer the adjacent plane length, the more difficult the correction. The adjacent plane length in each pair is obtained (Step H7). The pairs are sorted in the descending order of the adjacent plane length (Step H8). The adjacent plane length in each adjacent pair and the sorted order are shown in Table. 7.

TABLE 7

| Order | Adjacent Pair | Adjacent Plane Length |
| --- | --- | --- |
| 1 | D-G | 1.8 |
| 2 | I-J | 0.8 |
| 3 | B-D | 0.6 |
| 4 | B-C | 0.4 |
| 5 | G-H | 0.4 |
| 6 | G-J | 0.4 |
| 7 | H-I | 0.4 |
| 8 | A-B | 0.2 |
| 9 | A-D | 0.2 |
| 10 | B-E | 0.2 |
| 11 | C-D | 0.2 |
| 12 | C-F | 0.2 |
| 13 | D-E | 0.2 |
| 14 | F-G | 0.2 |
| 15 | F-I | 0.2 |
| 16 | G-I | 0.2 |

Then, an inversion relationship is obtained in the sorted order (Step H9) and phases are determined (Step H10). FIG. 27 is a graph showing the inversion relationship and a phase-determined result. Then, the procedure returns to Step H3, and the phases in the group 2 is determined, using the FIG. K as an initial figure (Step H4). FIG. 28 is a graph showing the phase-determined result. As clear from FIG. 28, since there is no phase-improper portion, the procedure advances to Step H11. There is no other group to be phase-determined, the phase-determined result and phase-improper portions are finally displayed (Step H12, FIG. 29).

(Sixth Embodiment)

FIG. 30 is a flowchart for explaining this embodiment. First, layout data shown in FIG. 31 is input (Step 11). An adjacent relationship is established such that all figures are classified into two groups A and B: in the group A, the figures are adjacent to each other within a distance S2 (0.2 μm) or smaller; and in the group B, the figures are adjacent to each other within a distance greater than S2 and equal to or smaller than S3 (0.3 μm) (Step 12). FIGS. 32 and 33 are graphs showing the adjacent relationship in the respective groups. Phases are determined with respect to the group A consisting of adjacent figures E, F, G and H (Steps 13 to 16). First, when the FIG. E is selected as an initial figure to determine the phases (Step 14), the relationship as shown in FIG. 32 is obtained, and the portion F-H is stored as a phase-improper portion (Step 15). Since there is no other figures in the group A, phases are to be determined with respect to the group B consisting of adjacent figures A, B, C, D and E (Steps 17 to 19). Since the phase of the figure E has already been determined in the process of the group A, the FIG. E is selected as an initial figure in the group B. As a result, the relationship as shown in FIG. 33 is obtained. Referring to FIG. 33, although a phase-improper portion is formed in the adjacent pair A-D, it is not regarded as a phase-improper portion (because the figures A and D are isolated figures, it is possible that the adjacent figures have the same phase). When the process of the group B is thus ended, the phase-determined result and the phase-improper portion stored in the process of the group A are displayed (Step 110, FIG. 34).

(Seventh Embodiment)

Figure 35:
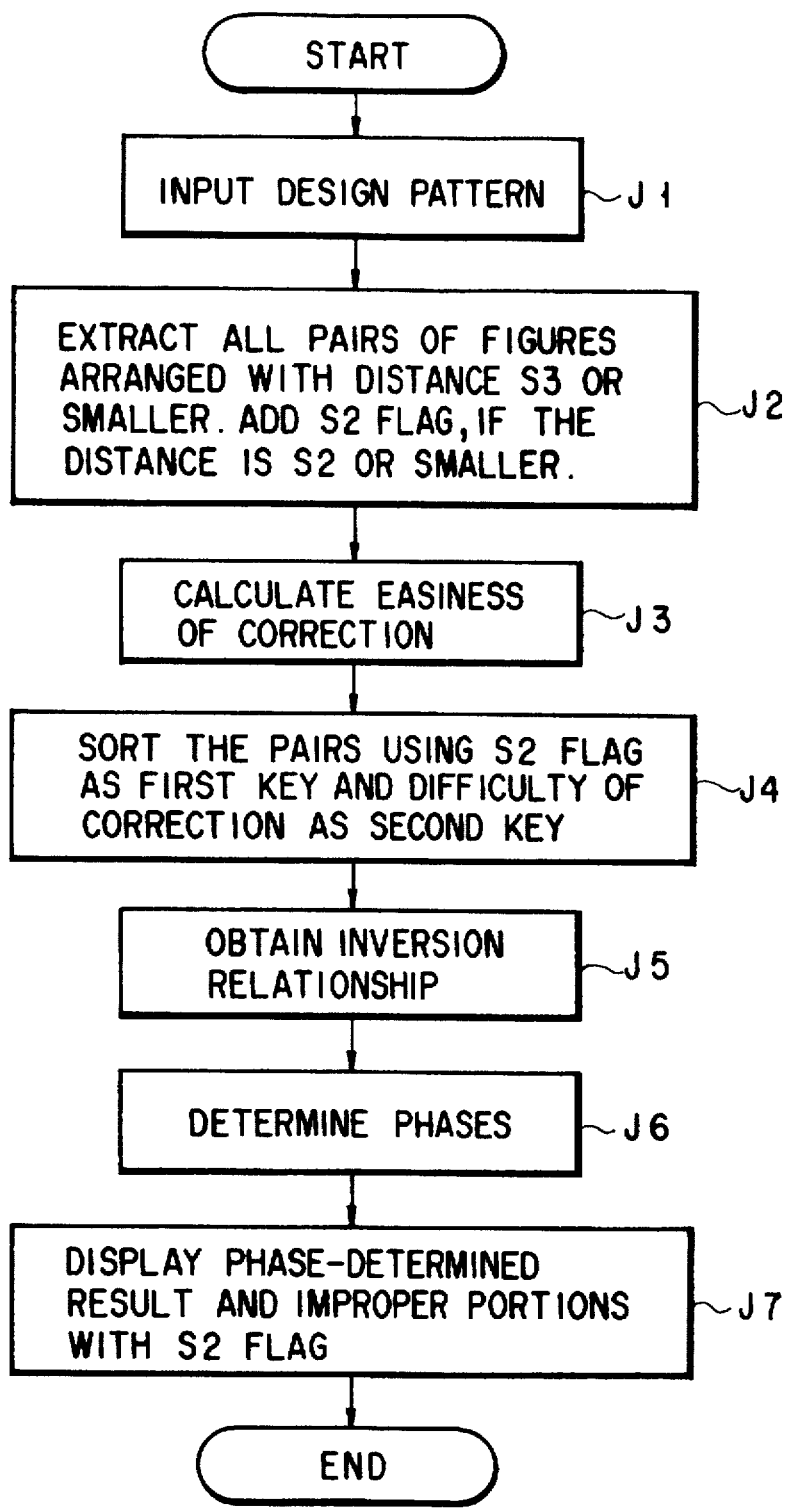
FIG. 35 is a flowchart for explaining a seventh embodiment of the present invention.

FIG. 35 is a flowchart for explaining this embodiment. First, layout data shown in FIG. 31 is input (Step J1). All pairs of adjacent figures, which are arranged with a distance S3 (0.3 μm) or smaller, are extracted. When the distance between adjacent figures is S2 (0.2 μm) or smaller, a flag (an S2 flag) indicating that the distance is S2 or smaller is added to the data of the adjacent pair (Step J2). It is determined that the longer the adjacent plane length, the more difficult the correction. The adjacent plane length in each pair is obtained (Step J3). The pairs are sorted using the S2 flag as a first key, and then the descending order of the adjacent plane length as a second key (Step J4). The adjacent plane length in each adjacent pair and the sorted order are shown in Table. 8.

TABLE 8

| Order | Adjacent Pair | S2 Flag | Adjacent Plane Length |
|---|---|---|---|
| 1 | E-F | ○ | 0.9 |
| 2 | F-G | ○ | 0.9 |
| 3 | G-H | ○ | 0.2 |
| 4 | E-H | ○ | 0.2 |
| 5 | F-H | ○ | 0.2 |
| 6 | A-D |   | 0.5 |
| 7 | B-D |   | 0.5 |
| 8 | A-B |   | 0.2 |
| 9 | A-C |   | 0.2 |
| 10 | C-D |   | 0.2 |
| 11 | C-E |   | 0.2 |

Figure 36:
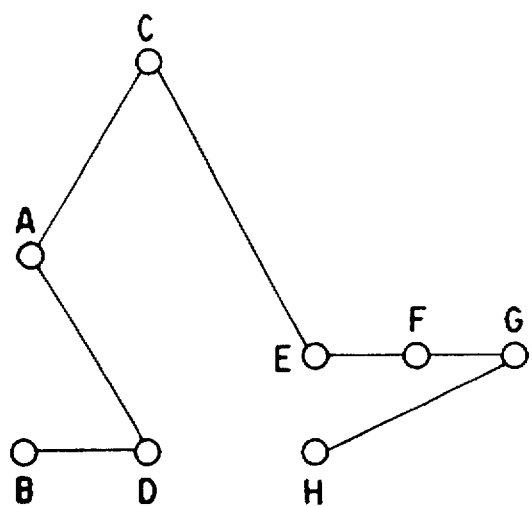
FIG. 36 is a diagram showing an inversion relationship according to the seventh embodiment.
Figure 37:
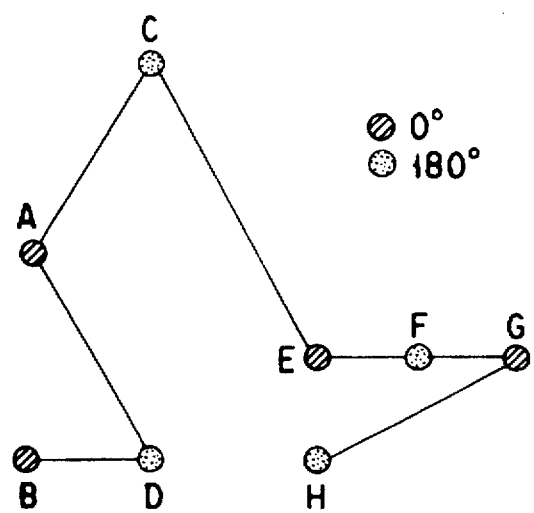
FIG. 37 is a diagram showing a phase-determined result based on the inversion relationship of the seventh embodiment.
Figure 38:
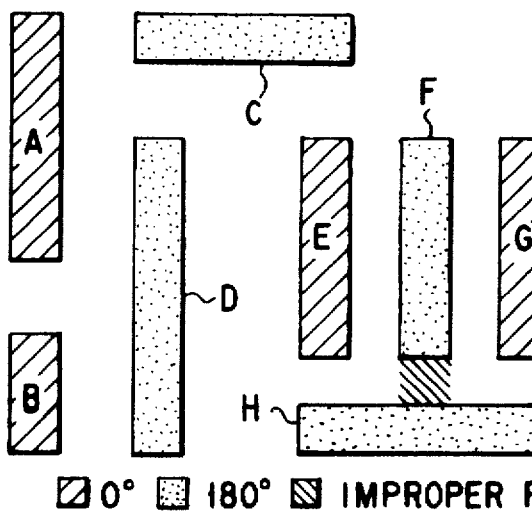
FIG. 38 is a diagram showing the phase-determined result and a phase-improper portion of the seventh embodiment.

Then, an inversion relationship is obtained in the sorted order (Step J5, FIG. 36) and phases are determined (Step J6, FIG. 37). Finally, the phase-determined result and the phase-improper portion with the S2 flag are displayed (Step J7, FIG. 38).

As described above, the principle of the present invention is applicable to a method for designing a photomask, which is used in photolithography using partially coherent incident light, the photomask including a plurality of transparent regions and a phase shifter for providing the incident light transmitting through the transparent region with a phase difference. With the present invention, a phase arrangement pattern, which is easy to correct, can be quickly found with a simple and high-speed algorithm. In addition, it is possible to arrange a shifter in an isolated pattern, in which the resolution can be improved, if a shifter is arranged so as to invert the phase. Therefore, a semiconductor device can be designed efficiently and the manufacturing cost can be reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the method comprising the steps of:

executing a fetching process for fetching mask layout data representing a plurality of figures corresponding to the plurality of transparent regions;

executing a first process for forming groups of figures adjacent to one another within a distance S1 from a plurality of figures corresponding to the plurality of transparent regions represented by the mask layout data, and determining phases of the figures in each of the groups such that paired figures adjacent to each other have opposite phases, thereby obtaining an improper group of paired figures adjacent to each other having the same phase; and executing a second process for determining phases of the figures, while an initial figure to initialize phases is successively changed in the improper group, thereby obtaining phase-improper portions and the result of the phase determination.

2. The method for designing a photomask according to claim 1, further comprising a step of executing a process for sorting the results of the phase determination obtained in the second process in each of groups in an ascending order of the number of improper portions, and displaying an initial figure used to initialize phases, a result of the phase determination and the figures in the improper portion, in a sorted order.

3. The method for designing a photomask according to claim 1, further comprising a step of executing a process for sorting the result of the phase determination obtained in the second process in each of groups in an order of easiness of correction based on comparison and evaluation as to whether an improper portion is easy to correct, and displaying an initial figure used to initialize phases, a result of the phase determination and the figures in the improper portion, in a sorted order.

4. A semiconductor manufacturing system comprising:

a layout data output unit for outputting photomask layout data;

a designing unit for executing the method claimed in claim 1; and an exposure unit for executing an exposure process based on photomask data designed by the designing unit.

5. A system for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the system comprising:

a fetching unit for fetching mask layout data representing a plurality of figures corresponding to the plurality of transparent regions;

a first process unit for forming groups of figures adjacent to one another within a distance S1 from a plurality of figures corresponding to the plurality of transparent regions represented by the mask layout data fetched by the fetching unit, and determining phases of the figures in each of the groups such that paired figures adjacent to each other have opposite phases, thereby obtaining an improper group of paired figures adjacent to each other having the same phase; and a second process unit for determining phases of the figures, while an initial figure to initialize phases is successively changed in the improper group, and obtaining improper portions and the phase determination through determining the phases.

6. A method for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the method comprising the steps of:

executing a fetching process for fetching mask layout data representing a plurality of figures corresponding to the plurality of transparent regions;

executing a first process for forming groups of figures adjacent to one another within a distance S1 from a plurality of figures corresponding to the plurality of transparent regions represented by the mask layout data, and determining phases of the figures in each of the groups such that paired figures adjacent to each other have opposite phases, thereby obtaining an improper group of paired figures adjacent to each other having the same phase; and executing a third process for designating a plurality of initial figures to initialize phases in an improper portion group, determining phases of the designated figures, and obtaining an improper portion and the phase determination in each of combinations of the phase-determined initial figures.

7. The method for designing a photomask according to claim 6, further comprising a step of executing a process for sorting the result of the phase determination obtained in the third process in each of groups in an ascending order of the number of improper portions, and displaying an initial figure used to initialize phases, a result of the phase determination and the figures in the improper portion, in a sorted order.

8. The method for designing a photomask according to claim 6, further comprising a step of executing a process for sorting the result of the phase determination obtained in the third process in each of groups in an order of easiness of correction based on comparison and evaluation as to whether an improper portion is easy to correct, and displaying an initial figure used to initialize phases, a result of the phase determination and the figures in the improper portion, in a sorted order.

9. A system for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the system comprising:

a fetching unit for fetching mask layout data representing a plurality of figures corresponding to the plurality of transparent regions;

a first process unit for forming groups of figures adjacent to one another within a distance S1 from a plurality of figures corresponding to the plurality of transparent regions represented by the mask layout data, determining phases of the figures in each of the groups such that paired figures adjacent to each other have opposite phases, and obtaining an improper group of paired figures adjacent to each other having the same phase; and a third process unit for designating a plurality of figures to initialize phases in an improper portion, determining phases of the designated figures, and obtaining the improper portions and the phase determination in each of combinations of the phase-determined figures of an improper portion group through determining the phases.

10. A method for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the method comprising the steps of:

extracting combinations of patterns adjacent to each other within a distance of a threshold value S2 as adjacent pairs from patterns corresponding to the transparent regions;

aligning the extracted adjacent pairs under a predetermined condition;

connecting the pair in the adjacent pairs, such that a pair of adjacent patterns are not connected to each other and loop cut is performed if a closed loop is formed by connecting the adjacent pair, and a pair of adjacent patterns are logically connected if a closed loop is not formed by connecting the adjacent patterns; and determining phases of light transmitted through the patterns, so that a phase of one of a pair of patterns is opposite to that of the other, on the basis of an inversion relationship finally obtained by the connecting step.

11. The method for designing a photomask according to claim 10, wherein the aligning step is a step of calculating difficulty of correction of the adjacent pairs and sorting the adjacent pairs in a descending order of the difficulty of correction, and forming inversion relationship in order of the sorted pairs.

12. The method for designing a photomask according to claim 10, wherein the aligning step is a step of forming an inversion relationship in an order of the extracted adjacent pairs.

13. The method for designing a photomask according to claim 12, further comprising a step extracting pairs of patterns adjacent to each other within a distance S3, greater than a distance S2 which cannot be resolved when phases of an adjacent pair of patterns are the same, and forming inversion relationship in order as each other within the distance S2, and the distance S3 which is greater than the distance S2 in the extracted pairs.

14. The method for designing a photomask according to claim 13, wherein a value of S3 is determined to be a critical distance as to whether resolution is improved by providing the phase difference.

15. The method for designing a photomask according to claim 10, further comprising a step of storing data of a single or a plurality of adjacent pairs obtained by a NAND operation of an adjacent relationship and an inversion relationship, extracting an adjacent pair of the same phase from the stored data after determining phases, and indicating the extracted pairs as a phase-improper portion.

16. The method for designing a photomask according to claim 10, wherein the threshold value S2 is defined as a limit distance which can be resolved only by Levenson type phase shifting method.

17. The method for designing a photomask according to claim 10, further comprising a step of storing data of loop-cut adjacent pairs, extracting an adjacent pair of the same phase from the stored data after determining phases, and indicating the extracted pairs as a phase-improper portion.

18. The method for designing a photomask according to claim 10, further comprising a step of forming an adjacent relationship of pairs of patterns adjacent to each other within a distance S3, greater than a distance S2 which cannot be resolved when phases of an adjacent pair of patterns are the same, and sorting the adjacent pairs by designating a distance between patterns of S2 or smaller as a first key, and difficulty of correction as a second key, and forming inversion relationship in order of the sorted pairs.

19. The method for designing a photomask according to claim 18, wherein a value of S3 is determined to be a critical distance as to whether resolution is improved by providing the phase difference.

20. A method for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the method comprising the steps of:

obtaining an adjacent relationship of patterns adjacent to each other within a distance of a threshold value S2 with respect to patterns corresponding to the transparent regions;

extracting combinations of patterns adjacent to each other in every adjacent group which is connected in accordance with the adjacent relationship; and processing the steps of sorting the combinations in a descending order of difficulty of correction, forming an inversion relationship based on a result of sorting, and determining phases of the patterns in accordance with the inversion relationship.

21. The method for designing a photomask according to claim 20, wherein the inversion relationship forming step is a step for forming an inversion relationship in a sorted order.

22. The method for designing a photomask according to claim 20, wherein the inversion relationship forming step is a step for forming an inversion relationship in an order of the extracted combinations of patterns in every adjacent group.

23. The method for designing a photomask according to claim 20, wherein the aligning step is a step of forming an inversion relationship in an order of the extracted adjacent pairs.

24. The method for designing a photomask according to claim 23, further comprising a step forming an adjacent relationship of pairs of patterns adjacent to each other within a distance S3, greater than a distance S2 which cannot be resolved when phases of an adjacent pair of patterns are the same, and forming inversion relationship in order as each other within the distance S2, and the distance S3 which is greater than the distance S2 in the extracted pairs.

25. The method for designing a photomask according to claim 20, further comprising a step of storing data of a single or a plurality of adjacent pairs obtained by a NAND operation of an adjacent relationship and an inversion relationship, extracting an adjacent pair of the same phase from the stored data after determining phases, and indicating the extracted pairs as a phase-improper portion.

26. The method for designing a photomask according to claim 20, wherein the threshold value S2 is defined as a limit distance which can be resolved only by Levenson type phase shifting method.

27. The method for designing a photomask according to claim 20, further comprising a step of storing data of loop-cut adjacent pairs, extracting an adjacent pair of the same phase from the stored data after determining phases, and indicating the extracted pairs as a phase-improper portion.

28. The method for designing a photomask according to claim 20, further comprising a step of forming an adjacent relationship of pairs of patterns adjacent to each other within a distance S3, greater than a distance S2 which cannot be resolved when phases of an adjacent pair of patterns are the same, and sorting the adjacent pairs by designating a distance between patterns of S2 or smaller as a first key, and difficulty of correction as a second key.

29. The method for designing a photomask according to claim 28, wherein a value of S3 is determined to be a critical distance as to whether resolution is improved by providing the phase difference.

30. The method for designing a photomask according to claim 28, further comprising a step of forming inversion relationship in the phase-improper group adjacent to each other, and determining phases of the patterns in accordance with the inversion relationships.

31. A method for designing a photomask, used in photolithography using partially coherent incident light, the photomask having a substrate on which a plurality of transparent regions and opaque regions are formed, at least one of the transparent regions including a phase shifter for providing the incident light transmitting through the transparent regions with a phase difference, the method comprising the steps of:

designating as S2 a distance which cannot be resolved when phases of an adjacent pair of patterns are the same, and as S3 a distance which is greater than the distance S2;

first, determining phases of patterns adjacent to each other with the distance S2 or smaller; and thereafter, determining phases of patterns adjacent to each other with a distance greater than S2 and equal to or smaller than S3.

32. The method for designing a photomask according to claim 31, wherein a value of S3 is determined to be a critical distance as to whether resolution is improved by providing the phase difference.

* * * * *